United States Patent
LaBerge

(10) Patent No.: US 7,519,788 B2
(45) Date of Patent: *Apr. 14, 2009

(54) SYSTEM AND METHOD FOR AN ASYNCHRONOUS DATA BUFFER HAVING BUFFER WRITE AND READ POINTERS

(75) Inventor: Paul A. LaBerge, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 965 days.

This patent is subject to a terminal disclaimer.

(21) Appl. No.: 10/861,145

(22) Filed: Jun. 4, 2004

(65) Prior Publication Data

US 2005/0286506 A1    Dec. 29, 2005

(51) Int. Cl.
*G06F 12/00* (2006.01)
(52) U.S. Cl. .................... 711/167; 711/5; 365/233.1
(58) Field of Classification Search ............... 711/5, 711/167; 365/233.1
See application file for complete search history.

(56) References Cited

U.S. PATENT DOCUMENTS

| | | | |
|---|---|---|---|
| 4,045,781 A | 8/1977 | Levy et al. | 364/200 |
| 4,240,143 A | 12/1980 | Besemer et al. | 364/200 |
| 4,245,306 A | 1/1981 | Besemer et al. | 364/200 |
| 4,253,144 A | 2/1981 | Bellamy et al. | 364/200 |
| 4,253,146 A | 2/1981 | Bellamy et al. | 364/200 |
| 4,608,702 A | 8/1986 | Hirzel et al. | 375/110 |
| 4,707,823 A | 11/1987 | Holdren et al. | 370/1 |
| 4,724,520 A | 2/1988 | Athanas et al. | 364/200 |
| 4,891,808 A | 1/1990 | Williams | 370/112 |
| 4,930,128 A | 5/1990 | Suzuki et al. | 371/12 |
| 4,953,930 A | 9/1990 | Ramsey et al. | 350/96.11 |
| 5,133,059 A | 7/1992 | Ziegler et al. | 711/140 |
| 5,241,506 A | 8/1993 | Motegi et al. | 365/210 |
| 5,243,703 A | 9/1993 | Farmwald et al. | 395/325 |
| 5,251,303 A | 10/1993 | Fogg, Jr. et al. | 395/275 |
| 5,269,022 A | 12/1993 | Shinjo et al. | 395/700 |
| 5,317,752 A | 5/1994 | Jewett et al. | 395/750 |

(Continued)

FOREIGN PATENT DOCUMENTS

EP    0849685 A2    6/1998

(Continued)

OTHER PUBLICATIONS

Hellwagner, H. et al., *"Enabling a PC Cluster for High-Performance Computing"*, The Speedup Journal, vol. 11, No. 1, Jun. 1997, pp. 1-9.

(Continued)

*Primary Examiner*—Kevin L Ellis
*Assistant Examiner*—Hashem Farrokh
(74) *Attorney, Agent, or Firm*—Dorsey & Whitney LLP

(57) ABSTRACT

A system and method for facilitating the adjustment of timing parameters between a memory controller operating in a first clock domain and a memory device operating in a second clock domain. A write pointer and a read pointer are monitored to provide a write-read pointer offset representing the timing between when read data is made available by the memory device and when the read data is retrieved by the memory controller. Based on the write-read pointer offset, adjustment to different timing parameters can be made.

46 Claims, 6 Drawing Sheets

U.S. PATENT DOCUMENTS

| | | | |
|---|---|---|---|
| 5,319,755 A | 6/1994 | Farmwald et al. | 395/325 |
| 5,327,553 A | 7/1994 | Jewett et al. | 395/575 |
| 5,355,391 A | 10/1994 | Horowitz et al. | 375/36 |
| 5,432,823 A | 7/1995 | Gasbarro et al. | 375/356 |
| 5,432,907 A | 7/1995 | Picazo, Jr. et al. | 395/200 |
| 5,442,770 A | 8/1995 | Barratt | 395/403 |
| 5,461,627 A | 10/1995 | Rypinski | 370/95.2 |
| 5,465,229 A | 11/1995 | Bechtolsheim et al. | 345/477 |
| 5,479,370 A | 12/1995 | Furuyama et al. | 365/189.12 |
| 5,497,476 A | 3/1996 | Oldfield et al. | 395/439 |
| 5,502,621 A | 3/1996 | Schumacher et al. | 361/760 |
| 5,544,319 A | 8/1996 | Acton et al. | 395/200.07 |
| 5,566,325 A | 10/1996 | Bruce, II et al. | 395/494 |
| 5,577,220 A | 11/1996 | Combs et al. | 395/416 |
| 5,581,767 A | 12/1996 | Katsuki et al. | 395/800 |
| 5,606,717 A | 2/1997 | Farmwald et al. | 395/856 |
| 5,638,334 A | 6/1997 | Farmwald et al. | 365/230.03 |
| 5,638,534 A | 6/1997 | Mote, Jr. | 395/485 |
| 5,659,713 A | 8/1997 | Goodwin et al. | 711/157 |
| 5,659,798 A | 8/1997 | Blumrich et al. | 395/846 |
| 5,706,224 A | 1/1998 | Srinivasan et al. | 365/49 |
| 5,715,456 A | 2/1998 | Bennett et al. | 395/652 |
| 5,729,709 A | 3/1998 | Harness | 395/405 |
| 5,748,616 A | 5/1998 | Riley | 370/242 |
| 5,796,413 A | 8/1998 | Shipp et al. | 345/522 |
| 5,818,844 A | 10/1998 | Singh et al. | 370/463 |
| 5,819,304 A | 10/1998 | Nilsen et al. | 711/5 |
| 5,822,255 A | 10/1998 | Uchida | 365/194 |
| 5,832,250 A | 11/1998 | Whittaker | 395/471 |
| 5,838,931 A | 11/1998 | Regenold et al. | 395/308 |
| 5,875,352 A | 2/1999 | Gentry et al. | 395/843 |
| 5,875,454 A | 2/1999 | Craft et al. | 711/113 |
| 5,887,159 A | 3/1999 | Burrows | 395/567 |
| 5,928,343 A | 7/1999 | Farmwald et al. | 710/104 |
| 5,966,724 A | 10/1999 | Ryan | 711/105 |
| 5,973,935 A | 10/1999 | Schoenfeld et al. | 361/813 |
| 5,973,951 A | 10/1999 | Bechtolsheim et al. | 365/52 |
| 5,978,567 A | 11/1999 | Rebane et al. | 395/200.49 |
| 5,987,196 A | 11/1999 | Noble | 385/14 |
| 6,006,340 A | 12/1999 | O'Connell | 713/600 |
| 6,023,726 A | 2/2000 | Saksena | 709/219 |
| 6,029,250 A | 2/2000 | Keeth | 713/400 |
| 6,031,241 A | 2/2000 | Silfvast et al. | 250/504 R |
| 6,033,951 A | 3/2000 | Chao | 438/253 |
| 6,061,263 A | 5/2000 | Boaz et al. | 365/51 |
| 6,061,296 A | 5/2000 | Ternullo, Jr. et al. | 365/233 |
| 6,067,262 A | 5/2000 | Irrinki et al. | 365/201 |
| 6,073,190 A | 6/2000 | Rooney | 710/56 |
| 6,076,139 A | 6/2000 | Welker et al. | 711/104 |
| 6,079,008 A | 6/2000 | Clery, III | 712/11 |
| 6,092,158 A | 7/2000 | Harriman et al. | 711/151 |
| 6,098,158 A | 8/2000 | Lay et al. | 711/162 |
| 6,105,075 A | 8/2000 | Ghaffari | 710/5 |
| 6,125,431 A | 9/2000 | Kobayashi | 711/154 |
| 6,128,703 A | 10/2000 | Bourekas et al. | 711/138 |
| 6,128,706 A | 10/2000 | Bryg et al. | 711/141 |
| 6,131,149 A | 10/2000 | Lu et al. | 711/167 |
| 6,134,624 A | 10/2000 | Burns et al. | 410/131 |
| 6,137,709 A | 10/2000 | Boaz et al. | 365/51 |
| 6,144,587 A | 11/2000 | Yoshida | 365/189.05 |
| 6,145,033 A | 11/2000 | Chee | 710/57 |
| 6,157,743 A | 12/2000 | Goris et al. | 382/233 |
| 6,157,962 A | 12/2000 | Hodges et al. | 710/1 |
| 6,167,465 A | 12/2000 | Parvin et al. | 710/22 |
| 6,167,486 A | 12/2000 | Lee et al. | 711/120 |
| 6,175,571 B1 | 1/2001 | Haddock et al. | 370/423 |
| 6,185,352 B1 | 2/2001 | Hurley | 385/114 |
| 6,185,676 B1 | 2/2001 | Poplingher et al. | 712/239 |
| 6,186,400 B1 | 2/2001 | Dvorkis et al. | 235/462.45 |
| 6,191,663 B1 | 2/2001 | Hannah | 333/17.3 |
| 6,201,724 B1 | 3/2001 | Ishizaki et al. | 365/49 |
| 6,208,180 B1 | 3/2001 | Fisch et al. | 327/141 |
| 6,212,590 B1 | 4/2001 | Melo et al. | 710/119 |
| 6,219,725 B1 | 4/2001 | Diehl et al. | 710/26 |
| 6,223,301 B1 | 4/2001 | Santeler et al. | 714/6 |
| 6,233,376 B1 | 5/2001 | Updegrove | 385/14 |
| 6,243,769 B1 | 6/2001 | Rooney | 710/56 |
| 6,243,831 B1 | 6/2001 | Mustafa et al. | 714/24 |
| 6,246,618 B1 | 6/2001 | Yamamoto et al. | 365/200 |
| 6,247,107 B1 | 6/2001 | Christie | 711/216 |
| 6,249,802 B1 | 6/2001 | Richardson et al. | 709/200 |
| 6,252,821 B1 | 6/2001 | Nizar et al. | 365/238.6 |
| 6,256,692 B1 | 7/2001 | Yoda et al. | 710/104 |
| 6,272,609 B1 | 8/2001 | Jeddeloh | 711/169 |
| 6,285,349 B1 | 9/2001 | Smith | 345/147 |
| 6,286,083 B1 | 9/2001 | Chin et al. | 711/151 |
| 6,294,937 B1 | 9/2001 | Crafts et al. | 327/158 |
| 6,301,637 B1 | 10/2001 | Krull et al. | 711/112 |
| 6,327,642 B1 | 12/2001 | Lee et al. | 711/120 |
| 6,330,205 B2 | 12/2001 | Shimizu et al. | 365/230.06 |
| 6,347,055 B1 | 2/2002 | Motomura | 365/189.05 |
| 6,349,363 B2 | 2/2002 | Cai et al. | 711/129 |
| 6,356,573 B1 | 3/2002 | Jonsson et al. | 372/46 |
| 6,367,074 B1 | 4/2002 | Bates et al. | 717/11 |
| 6,370,068 B2 | 4/2002 | Rhee | 365/196 |
| 6,370,611 B1 | 4/2002 | Callison et al. | 711/105 |
| 6,373,777 B1 | 4/2002 | Suzuki | 365/230.03 |
| 6,381,190 B1 | 4/2002 | Shinkai | 365/230.03 |
| 6,389,514 B1 | 5/2002 | Rokicki | 711/136 |
| 6,392,653 B1 | 5/2002 | Malandain et al. | 345/501 |
| 6,401,213 B1 | 6/2002 | Jeddeloh | 713/401 |
| 6,405,280 B1 | 6/2002 | Ryan | 711/105 |
| 6,421,744 B1 | 7/2002 | Morrison et al. | 710/22 |
| 6,430,696 B1 | 8/2002 | Keeth | 713/503 |
| 6,433,785 B1 | 8/2002 | Garcia et al. | 345/531 |
| 6,434,639 B1 | 8/2002 | Haghighi | 710/39 |
| 6,434,696 B1 | 8/2002 | Kang | 713/2 |
| 6,434,736 B1 | 8/2002 | Schaecher et al. | 716/17 |
| 6,438,622 B1 | 8/2002 | Haghighi et al. | 710/1 |
| 6,438,668 B1 | 8/2002 | Esfahani et al. | 711/165 |
| 6,449,308 B1 | 9/2002 | Knight, Jr. et al. | 375/212 |
| 6,453,393 B1 | 9/2002 | Holman et al. | 711/154 |
| 6,460,108 B1 | 10/2002 | McCoskey et al. | 710/310 |
| 6,460,114 B1 | 10/2002 | Jeddeloh | 711/120 |
| 6,462,978 B2 | 10/2002 | Shibata et al. | 365/63 |
| 6,463,059 B1 | 10/2002 | Movshovich et al. | 370/389 |
| 6,467,013 B1 | 10/2002 | Nizar | 711/1 |
| 6,470,422 B2 | 10/2002 | Cai et al. | 711/129 |
| 6,473,828 B1 | 10/2002 | Matsui | 711/104 |
| 6,477,592 B1 | 11/2002 | Chen et al. | 710/52 |
| 6,477,614 B1 | 11/2002 | Leddige et al. | 711/5 |
| 6,477,621 B1 | 11/2002 | Lee et al. | 711/120 |
| 6,479,322 B2 | 11/2002 | Kawata et al. | 438/109 |
| 6,487,628 B1 | 11/2002 | Duong et al. | 710/313 |
| 6,490,188 B2 | 12/2002 | Nuxoll et al. | 365/63 |
| 6,493,803 B1 | 12/2002 | Pham et al. | 711/147 |
| 6,496,193 B1 | 12/2002 | Surti et al. | 345/552 |
| 6,496,909 B1 | 12/2002 | Schimmel | 711/163 |
| 6,501,471 B1 | 12/2002 | Venkataraman et al. | 345/424 |
| 6,502,161 B1 | 12/2002 | Perego et al. | 711/5 |
| 6,505,287 B2 | 1/2003 | Uematsu | 711/170 |
| 6,523,092 B1 | 2/2003 | Fanning | 711/134 |
| 6,523,093 B1 | 2/2003 | Bogin et al. | 711/137 |
| 6,526,483 B1 | 2/2003 | Cho et al. | 711/154 |
| 6,539,490 B1 | 3/2003 | Forbes et al. | 713/401 |
| 6,552,564 B1 | 4/2003 | Forbes et al. | 326/30 |
| 6,553,476 B1 | 4/2003 | Ayaki et al. | 711/204 |
| 6,564,329 B1 | 5/2003 | Cheung et al. | 713/322 |
| 6,587,912 B2 | 7/2003 | Leddige et al. | 711/5 |
| 6,590,816 B2 | 7/2003 | Perner | 365/200 |
| 6,594,713 B1 | 7/2003 | Fuoco et al. | 710/31 |
| 6,594,722 B1 | 7/2003 | Willke, II et al. | 710/313 |
| 6,598,154 B1 | 7/2003 | Vaid et al. | 712/237 |
| 6,615,325 B2 | 9/2003 | Mailloux et al. | 711/154 |

| | | | |
|---|---|---|---|
| 6,622,227 B2 | 9/2003 | Zumkehr et al. | 711/167 |
| 6,628,294 B1 | 9/2003 | Sadowsky et al. | 345/568 |
| 6,629,220 B1 | 9/2003 | Dyer | 711/158 |
| 6,631,440 B2 | 10/2003 | Jenne et al. | 711/105 |
| 6,633,959 B2 | 10/2003 | Arimilli et al. | 711/141 |
| 6,636,110 B1 | 10/2003 | Ooishi et al. | 327/565 |
| 6,646,929 B1 | 11/2003 | Moss et al. | 365/194 |
| 6,647,470 B1 | 11/2003 | Janzen | 711/154 |
| 6,658,509 B1 | 12/2003 | Bonella et al. | 710/100 |
| 6,662,304 B2 | 12/2003 | Keeth et al. | 713/400 |
| 6,665,202 B2 | 12/2003 | Lindahl et al. | 365/49 |
| 6,667,895 B2 | 12/2003 | Jang et al. | 365/63 |
| 6,681,292 B2 | 1/2004 | Creta et al. | 711/119 |
| 6,697,926 B2 | 2/2004 | Johnson et al. | 711/167 |
| 6,704,817 B1 | 3/2004 | Steinman et al. | 710/100 |
| 6,715,018 B2 | 3/2004 | Farnworth et al. | 710/300 |
| 6,718,440 B2 | 4/2004 | Maiyuran et al. | 711/137 |
| 6,721,195 B2 | 4/2004 | Brunelle et al. | 365/63 |
| 6,724,685 B2 | 4/2004 | Braun et al. | 365/233 |
| 6,728,800 B1 | 4/2004 | Lee et al. | 710/54 |
| 6,731,548 B2 | 5/2004 | Pax | 365/189.12 |
| 6,735,679 B1 | 5/2004 | Herbst et al. | 711/167 |
| 6,735,682 B2 | 5/2004 | Segelken et al. | 711/220 |
| 6,745,275 B2 | 6/2004 | Chang | 710/305 |
| 6,751,703 B2 | 6/2004 | Chilton | 711/113 |
| 6,754,117 B2 | 6/2004 | Jeddeloh | 365/201 |
| 6,754,812 B1 | 6/2004 | Abdallah et al. | 712/234 |
| 6,756,661 B2 | 6/2004 | Tsuneda et al. | 257/673 |
| 6,760,833 B1 | 7/2004 | Dowling | 712/34 |
| 6,771,538 B2 | 8/2004 | Shukuri et al. | 365/185.05 |
| 6,772,295 B2 | 8/2004 | Spencer et al. | 711/137 |
| 6,775,747 B2 | 8/2004 | Venkatraman | 711/137 |
| 6,782,466 B1 | 8/2004 | Steele et al. | 711/209 |
| 6,788,104 B2 | 9/2004 | Singh et al. | 326/39 |
| 6,789,173 B1 | 9/2004 | Tanaka et al. | 711/147 |
| 6,792,059 B2 | 9/2004 | Yuan et al. | 375/354 |
| 6,792,496 B2 | 9/2004 | Aboulenein et al. | 710/306 |
| 6,795,899 B2 | 9/2004 | Dodd et al. | 711/137 |
| 6,799,246 B1 | 9/2004 | Wise et al. | 711/117 |
| 6,799,268 B1 | 9/2004 | Boggs et al. | 712/228 |
| 6,804,760 B2 | 10/2004 | Wiliams | 711/170 |
| 6,804,764 B2 | 10/2004 | LaBerge et al. | 711/170 |
| 6,807,630 B2 | 10/2004 | Lay et al. | 713/2 |
| 6,811,320 B1 | 11/2004 | Abbott | 385/58 |
| 6,816,947 B1 | 11/2004 | Huffman | 711/151 |
| 6,820,181 B2 | 11/2004 | Jeddeloh et al. | 711/169 |
| 6,821,029 B1 | 11/2004 | Grung et al. | 385/92 |
| 6,823,023 B1 | 11/2004 | Hannah | 375/296 |
| 6,829,705 B2 | 12/2004 | Smith | 713/1 |
| 6,845,409 B1 | 1/2005 | Talagala et al. | 710/20 |
| 6,889,304 B2 | 5/2005 | Perego et al. | 711/170 |
| 6,910,109 B2 | 6/2005 | Holman et al. | 711/156 |
| 6,928,528 B1 | 8/2005 | Hewitt | 711/156 |
| 6,941,433 B1* | 9/2005 | Libby et al. | 711/167 |
| 6,980,042 B2 | 12/2005 | LaBerge | 327/291 |
| 7,254,075 B2 | 8/2007 | Woo et al. | 365/207 |
| 7,318,130 B2 | 1/2008 | Morrow et al. | 711/154 |
| 2001/0039612 A1 | 11/2001 | Lee | 713/2 |
| 2002/0002656 A1 | 1/2002 | Honma et al. | 711/122 |
| 2002/0078298 A1 | 6/2002 | Jeddeloh | 711/118 |
| 2002/0112119 A1 | 8/2002 | Halbert et al. | 711/115 |
| 2002/0116588 A1 | 8/2002 | Beckert et al. | |
| 2002/0120709 A1 | 8/2002 | Chow et al. | 709/213 |
| 2002/0144064 A1 | 10/2002 | Fanning | 711/144 |
| 2002/0178319 A1 | 11/2002 | Sanchez-Olea | 710/305 |
| 2003/0005223 A1 | 1/2003 | Coulson et al. | 711/118 |
| 2003/0014578 A1 | 1/2003 | Pax | 710/100 |
| 2003/0043158 A1 | 3/2003 | Wasserman et al. | 345/545 |
| 2003/0043426 A1 | 3/2003 | Baker et al. | 359/109 |
| 2003/0093630 A1 | 5/2003 | Richard et al. | 711/154 |
| 2003/0149809 A1 | 8/2003 | Jensen et al. | 710/22 |
| 2003/0156639 A1 | 8/2003 | Liang | 375/240.01 |
| 2003/0163649 A1 | 8/2003 | Kapur et al. | 711/146 |
| 2003/0177320 A1 | 9/2003 | Sah et al. | 711/158 |
| 2003/0193927 A1 | 10/2003 | Hronik | 370/351 |
| 2003/0217223 A1 | 11/2003 | Nino, Jr. et al. | 711/105 |
| 2003/0223295 A1 | 12/2003 | Ozguz et al. | 365/201 |
| 2003/0227798 A1 | 12/2003 | Pax | 365/189.12 |
| 2003/0229762 A1 | 12/2003 | Maiyuran et al. | 711/137 |
| 2003/0229770 A1 | 12/2003 | Jeddeloh | 711/213 |
| 2004/0006671 A1 | 1/2004 | Handgen et al. | 711/137 |
| 2004/0015666 A1* | 1/2004 | Rojas et al. | 711/159 |
| 2004/0019728 A1 | 1/2004 | Sharma | 710/306 |
| 2004/0022094 A1 | 2/2004 | Radhakrishnan et al. | 365/200 |
| 2004/0024959 A1 | 2/2004 | Taylor | 711/105 |
| 2004/0024978 A1 | 2/2004 | Jeddeloh | 711/154 |
| 2004/0034753 A1 | 2/2004 | Jeddeloh | 711/163 |
| 2004/0039886 A1 | 2/2004 | Christofferson et al. | 711/156 |
| 2004/0044833 A1 | 3/2004 | Ryan | 711/5 |
| 2004/0049649 A1 | 3/2004 | Durrant | 711/165 |
| 2004/0064602 A1 | 4/2004 | George | 710/22 |
| 2004/0122988 A1 | 6/2004 | Han et al. | 710/5 |
| 2004/0126115 A1 | 7/2004 | Levy et al. | 398/116 |
| 2004/0144994 A1 | 7/2004 | Lee et al. | 257/200 |
| 2004/0158677 A1 | 8/2004 | Dodd | 711/118 |
| 2004/0170196 A1* | 9/2004 | Susnow | 370/503 |
| 2004/0236885 A1 | 11/2004 | Fredriksson et al. | 710/100 |
| 2004/0260864 A1 | 12/2004 | Lee et al. | 711/101 |
| 2004/0260891 A1 | 12/2004 | Jeddeloh et al. | 711/154 |
| 2004/0260909 A1 | 12/2004 | Lee et al. | 711/213 |
| 2004/0268061 A1 | 12/2004 | Khare et al. | 711/151 |
| 2005/0044327 A1 | 2/2005 | Howard et al. | 711/147 |
| 2005/0060533 A1 | 3/2005 | Woo et al. | 713/100 |
| 2005/0066137 A1 | 3/2005 | Jeddeloh et al. | 711/154 |
| 2005/0071542 A1 | 3/2005 | Weber et al. | 711/105 |
| 2005/0078506 A1 | 4/2005 | Rao et al. | 365/154 |
| 2005/0105350 A1 | 5/2005 | Zimmerman | 365/201 |
| 2005/0149774 A1 | 7/2005 | Jeddeloh et al. | 713/500 |
| 2005/0172084 A1 | 8/2005 | Jeddeloh | 711/154 |
| 2005/0216648 A1 | 9/2005 | Jeddeloh | 710/311 |
| 2005/0216678 A1 | 9/2005 | Jeddeloh | 711/154 |
| 2005/0223161 A1 | 10/2005 | Jeddeloh | 711/105 |
| 2005/0228939 A1 | 10/2005 | Janzen | 711/105 |
| 2005/0246558 A1 | 11/2005 | Ku | 713/300 |
| 2006/0085616 A1 | 4/2006 | Zeighami et al. | 711/167 |
| 2006/0212655 A1 | 9/2006 | Jeddeloh | 711/154 |
| 2007/0033353 A1 | 2/2007 | Jeddeloh | 711/154 |

FOREIGN PATENT DOCUMENTS

| | | |
|---|---|---|
| JP | 06-004401 | 1/1994 |
| JP | 06-028180 | 2/1994 |
| JP | 08-185383 | 7/1996 |
| JP | 10-228413 | 8/1998 |
| JP | 2001265539 A | 9/2001 |
| WO | WO 93/19422 | 9/1993 |
| WO | 97-04401 | 2/1997 |
| WO | 99-23570 | 5/1999 |
| WO | 99-34294 | 7/1999 |
| WO | 00-43902 | 7/2000 |
| WO | WO 02/27499 A2 | 4/2002 |

OTHER PUBLICATIONS

Intel, "Flash Memory PCI Add-In Card for Embedded Systems", Application Note AP-758, Sep. 1997, pp. i-13.

Shanley, T. et al., "PCI System Architecture", Third Edition, Mindshare, Inc., 1995, pp. 24-25.

Intel, "Intel 840 Chipset: 82840 Memory Controller Hub (MCH)", Datasheet, Oct. 1999, pp. 1-178.

Micron Technology, Inc., "Synchronous DRAM Module 512MB/ 1GB (x72, ECC) 168-PIN Registered FBGA SDRAM DIMM", Micron Technology, Inc., 2002, pp. 1-23.

"Free On-Line Dictionary of Computing" entry 'Flash Erasable Programmable Read-Only Memory, online May 17, 2004 [http://foldoc.doc.ic.ac.uk/foldoc/foldoc.cgi?flash+memory].

* cited by examiner

SYSTEM AND METHOD FOR AN ASYNCHRONOUS DATA BUFFER HAVING BUFFER WRITE AND READ POINTERS

TECHNICAL FIELD

The present invention is related generally to a memory system for a processor-based system, and more particularly, to synchronizing the coupling of read data across different clock domains and providing information related to the timing margin in crossing the different clock domains.

BACKGROUND OF THE INVENTION

Computer systems use memory devices, such as dynamic random access memory ("DRAM") devices, to store data that are accessed by a processor. These memory devices are normally used as system memory in a computer system. In a typical computer system, the processor communicates with the system memory through a processor bus and a memory controller. The memory devices of the system memory, typically arranged in memory modules having multiple memory devices, are coupled through a memory bus to the memory controller. The processor issues a memory request, which includes a memory command, such as a read command, and an address designating the location from which data or instructions are to be read. The memory controller uses the command and address to generate appropriate command signals as well as row and column addresses, which are applied to the system memory through the memory bus. In response to the commands and addresses, data are transferred between the system memory and the processor. The memory controller is often part of a system controller, which also includes bus bridge circuitry for coupling the processor bus to an expansion bus, such as a PCI bus.

In memory systems, high data bandwidth is desirable. Generally, bandwidth limitations are not related to the memory controllers since the memory controllers sequence data to and from the system memory as fast as the memory devices allow. One approach that has been taken to increase bandwidth is to increase the speed of the memory data bus coupling the memory controller to the memory devices. Thus, the same amount of information can be moved over the memory data bus in less time. However, despite increasing memory data bus speeds, a corresponding increase in bandwidth does not result. One reason for the non-linear relationship between data bus speed and bandwidth is the hardware limitations within the memory devices themselves. That is, the memory controller has to schedule all memory commands to the memory devices such that the hardware limitations are honored. Although these hardware limitations can be reduced to some degree through the design of the memory device, a compromise must be made because reducing the hardware limitations typically adds cost, power, and/or size to the memory devices, all of which are undesirable alternatives. Thus, given these constraints, although it is easy for memory devices to move "well-behaved" traffic at ever increasing rates, for example, sequel traffic to the same page of a memory device, it is much more difficult for the memory devices to resolve "badly-behaved traffic," such as bouncing between different pages or banks of the memory device. As a result, the increase in memory data bus bandwidth does not always yield a corresponding increase in information bandwidth.

In addition to the limited bandwidth between processors and memory devices, the performance of computer systems is also limited by latency problems that increase the time required to read data from system memory devices. More specifically, when a memory device read command is coupled to a system memory device, such as a synchronous DRAM ("SDRAM") device, the read data are output from the SDRAM device only after a delay of several clock periods. Therefore, although SDRAM devices can synchronously output burst data at a high data rate, the delay in initially providing the data can significantly slow the operating speed of a computer system using such SDRAM devices. Increasing the memory data bus speed can be used to help alleviate the latency issue. However, as with bandwidth, the increase in memory data bus speeds do not yield a linear reduction of latency, for essentially the same reasons previously discussed.

Although increasing memory data bus speed has, to some degree, been successful in increasing bandwidth and reducing latency, other issues are raised by this approach. For example, as the speed of the memory data bus increases, loading on the memory bus needs to be decreased in order to maintain signal integrity since traditionally, there has only been wire between the memory controller and the memory slots into which the memory modules are plugged. Several approaches have been taken to address the memory bus loading issue. For example, reducing the number of memory slots to limit the number of memory modules that contribute to the loading of the memory bus, adding buffer circuits on a memory module in order to provide sufficient fanout of control signals to the memory devices on the memory module, and providing multiple memory device interfaces on the memory module since there are too few memory module connectors on a single memory device interface. The effectiveness of these conventional approaches are, however, limited. A reason why these techniques were used in the past is that it was cost-effective to do so. However, when only one memory module can be plugged in per interface, it becomes too costly to add a separate memory interface for each memory slot. In other words, it pushes the system controllers package out of the commodity range and into the boutique range, thereby, greatly adding cost.

One recent approach that allows for increased memory data bus speed in a cost effective manner is the use of multiple memory devices coupled to the processor through a memory hub. A computer system 100 shown in FIG. 1 uses a memory hub architecture. The computer system 100 includes a processor 104 for performing various computing functions, such as executing specific software to perform specific calculations or tasks. The processor 104 includes a processor bus 106 that normally includes an address bus, a control bus, and a data bus. The processor bus 106 is typically coupled to cache memory 108, which, is typically static random access memory ("SRAM"). Finally, the processor bus 106 is coupled to a system controller 110, which is also sometimes referred to as a bus bridge. The system controller 110 serves as a communications path to the processor 104 for a variety of other components. For example, as shown in FIG. 1, the system controller 110 includes a graphics port that is typically coupled to a graphics controller 112, which is, in turn, coupled to a video terminal 114. The system controller 110 is also coupled to one or more input devices 118, such as a keyboard or a mouse, to allow an operator to interface with the computer system 100. Typically, the computer system 100 also includes one or more output devices 120, such as a printer, coupled to the processor 104 through the system controller 110. One or more data storage devices 124 are also typically coupled to the processor 104 through the system controller 110 to allow the processor 104 to store data or retrieve data from internal or external storage media (not shown). Examples of typical storage devices 124 include hard and floppy disks, tape cassettes, and compact disk read-only memories (CD-ROMs).

The system controller 110 includes a memory hub controller 128 that is coupled to the processor 104. The system controller 110 is further coupled over a high speed bi-directional or unidirectional system controller/hub interface 134 to several memory modules 130a-n. As shown in FIG. 1, the controller/hub interface 134 includes a downstream bus 154 and an upstream bus 156 which are used to couple data, address, and/or control signals away from or toward, respectively, the memory hub controller 128. Typically, the memory modules 130a-n are coupled in a point-to-point or daisy chain architecture such that the memory modules 130a-n are connected one to another in series. Thus, the system controller 110 is coupled to a first memory module 130a, with the first memory module 130a connected to a second memory module 130b, and the second memory module 130b coupled to a third memory module 130c, and so on in a daisy chain fashion. Each memory module 130a-n includes a memory hub 140 that is coupled to the system controller/hub interface 134, and is further coupled a number of memory devices 148 through command, address and data buses, collectively shown as local memory bus 150. The memory hub 140 efficiently routes memory requests and responses between the memory hub controller 128 and the memory devices 148.

The memory devices 148 on the memory modules 130a-n are typically capable of operating at high clock frequencies in order to facilitate the relatively high speed operation of the overall memory system. Consequently, computer systems employing this architecture can also use the high-speed system controller/hub interface 134 to complement the high clock speeds of the memory devices 148. Additionally, with a memory hub based system, signal integrity can be maintained on the system controller/hub interface 134 since the signals are typically transmitted through multiple memory hubs 140 to and from the memory hub controller 128. Moreover, this architecture also provides for easy expansion of the system memory without concern for degradation in signal quality as more memory modules are added, such as occurs in conventional memory bus architectures.

Although the memory hub architecture shown in FIG. 1 provides improved memory system performance, the design of the hub memory system, and more generally, computer systems including such a memory hub architecture, becomes increasingly difficult. For example, in many hub based memory systems, the processor is coupled through a memory hub controller to each of several memory hubs via a high speed bus or link over which signals, such as command, address, or data signals, are transferred at a very high rate. The memory hubs are, in turn, coupled to several memory devices via buses that must also operate at a very high speed. However, as transfer rates increase, the time for which a signal represents valid information is decreasing. As commonly referenced by those ordinarily skilled in the art, the window or "eye" for when the signals are valid decreases at higher transfer rates. With specific reference to data signals, the "data eye" decreases. As understood by one skilled in the art, the data eye for each of the data signals defines the actual duration that each signal is valid after various factors affecting the signal are considered, such as timing skew, voltage and current drive capability, and the like. In the case of timing skew of signals, it often arises from a variety of timing errors such as loading on the lines of the bus, the physical lengths of such lines, and drifting operating conditions.

One approach to alleviating timing problems in memory devices is to use a delay-locked loop (DLL) to lock or align the receipt of read data from a memory device and a capture strobe signal used to latch the read data in a memory hub. More specifically, a read strobe signal is output by the memory devices along with read data signals. Although the timing relationship between the read strobe signal and the read data is generally fixed, the timing of when the read strobe signal and the read data are provided by the memory device to a memory hub may slowly drift in relation to a core clock domain used to synchronize operation of the memory hub and the memory device. The timing may slowly drift due to variations in the operating conditions, such as increasing operating temperature or voltage variations. In such case, the read strobe signal and read data may not be present in the memory hub at the proper time. To alleviate this problem, a DLL included in the memory device is used to maintain synchronization of the operation of the memory device and the memory controller. This is accomplished by the memory device by aligning its output strobe to an input clock signal that is sourced from the memory controller or provided by a common clock signal sourced to the memory controller and memory device. That is, as the timing between the memory device and memory hub begins to drift, the DLL can adjust the timing of internal clock signals of the memory device relative to the core clock signal thereby "re-synchronizing" operation of the memory device and the memory hub. The DLL is thus effective in preventing substantial drifting of the read data strobe and the read data in relation to the core clock domain. As transfer rates increase, however, the timing specifications for the DLL become more stringent and therefore increasingly difficult to meet. DLL circuitry sufficient to accommodate such timing needs often consume substantial power as well. Furthermore, the amount of circuitry required to implement a suitable DLL can materially reduce the amount of space that could otherwise be used for memory device circuitry, thereby either increasing the cost or reducing the storage capacity of such memory devices.

There is accordingly a need for a system and method that avoids the need to precisely control the timing relationships between a memory hub clock domain and the receipt of read data signals at the memory hub in a manner that avoids the need for extensive DLL or DL circuitry.

SUMMARY OF THE INVENTION

In one aspect of the present invention, a system for facilitating the adjustment of timing parameters between a memory controller operating in a first clock domain and a memory device operating in a second clock domain monitors a write pointer and a read pointer to provide a write-read pointer offset representing the timing between when read data is made available by the memory device and when the read data is retrieved by the memory controller. Based on the write-read pointer offset, adjustment to different timing parameters can be made.

Such a system can include a data buffer coupled to the memory device and having a plurality of data locations at which read data are respectively stored and a multiplexer coupled to the data buffer to selectively couple read data stored at respective data locations of the data buffer to an output terminal in accordance with a selection signal. A write pointer circuit is coupled to the memory device and the data buffer to generate a write pointer signal to sequentially select one of the plurality of data locations of the data buffer for storing read data received from the memory device responsive to a strobe signal provided by the memory device. A read pointer circuit is coupled to the multiplexer to generate responsive to the core clock signal a read pointer signal provided to the multiplexer to sequentially select one of the plurality of data locations of the buffer from which the read data stored therein is coupled to the output terminal of the multiplexer. A write-read pointer compare circuit coupled to the write and read pointer circuits compares the write and read pointer signals to generate a write-read pointer offset signal indicative of the comparison.

In another aspect of the present invention, a method of adjusting the relative timing between issuing memory write commands and memory read commands includes storing read data provided by at least one memory device in sequentially selected data locations of a buffer, the data location at which read data are currently stored selected by a write pointer. The read data stored in the buffer is retrieved from sequentially selected data locations, the data location from which read data are currently retrieved selected by a read pointer. A write-read pointer offset is generated indicative of a data location offset between the data location selected by the write pointer and the data location selected by the read pointer, the timing between the issuance of memory write commands and memory read commands is adjusted based on the write-read pointer offset.

DETAILED DESCRIPTION OF PREFERRED EMBODIMENTS

Embodiments of the present invention are directed to a read data synchronization circuit for coupling read data across two clock domains and providing information on the timing margin between when read data is made available and when the data can be retrieved. Certain details are set forth below to provide a sufficient understanding of various embodiments of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
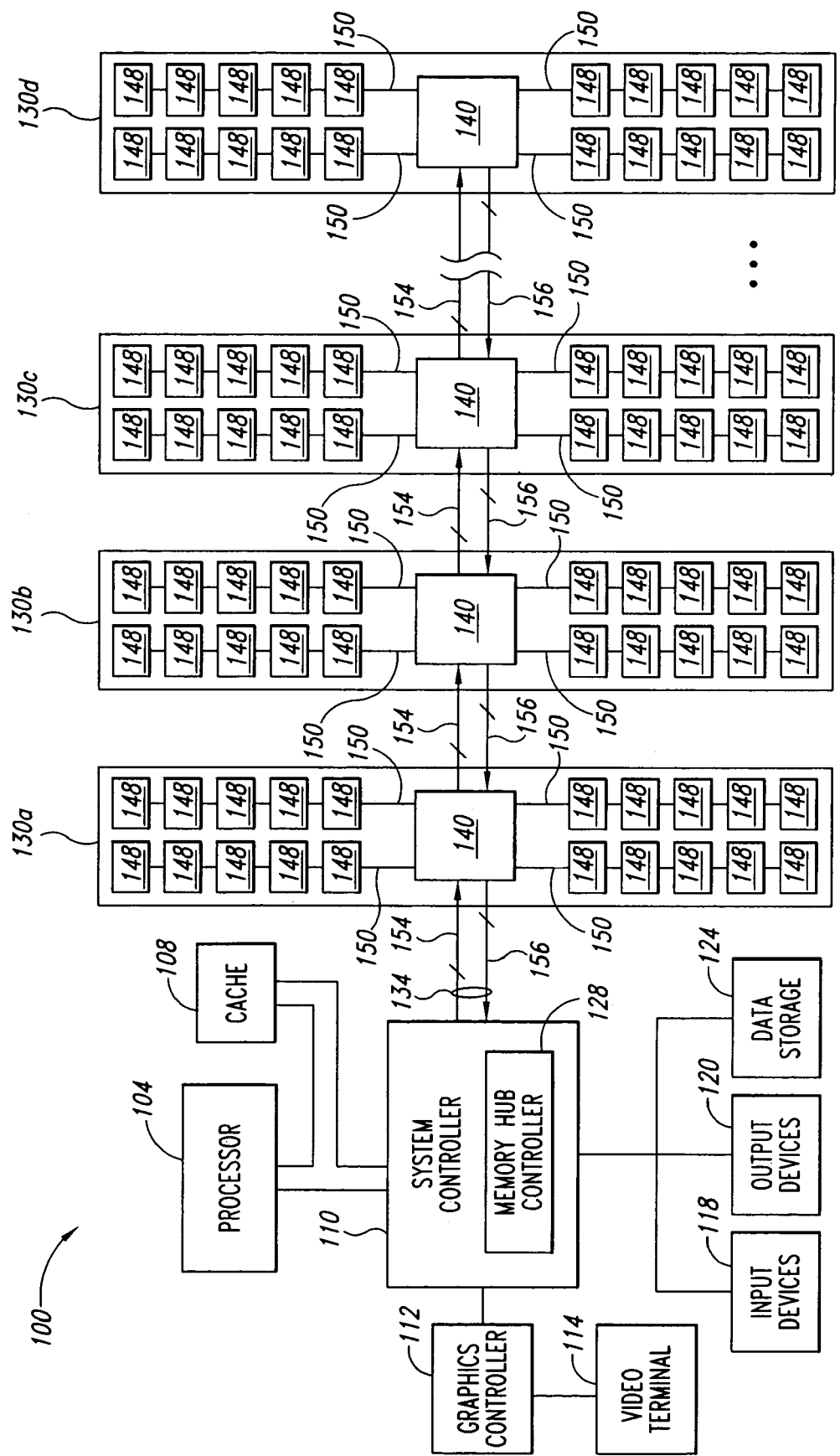
FIG. 1 is a partial block diagram of a computer system having a memory hub based system memory in which embodiments of the present invention can be implemented.
Figure 2:
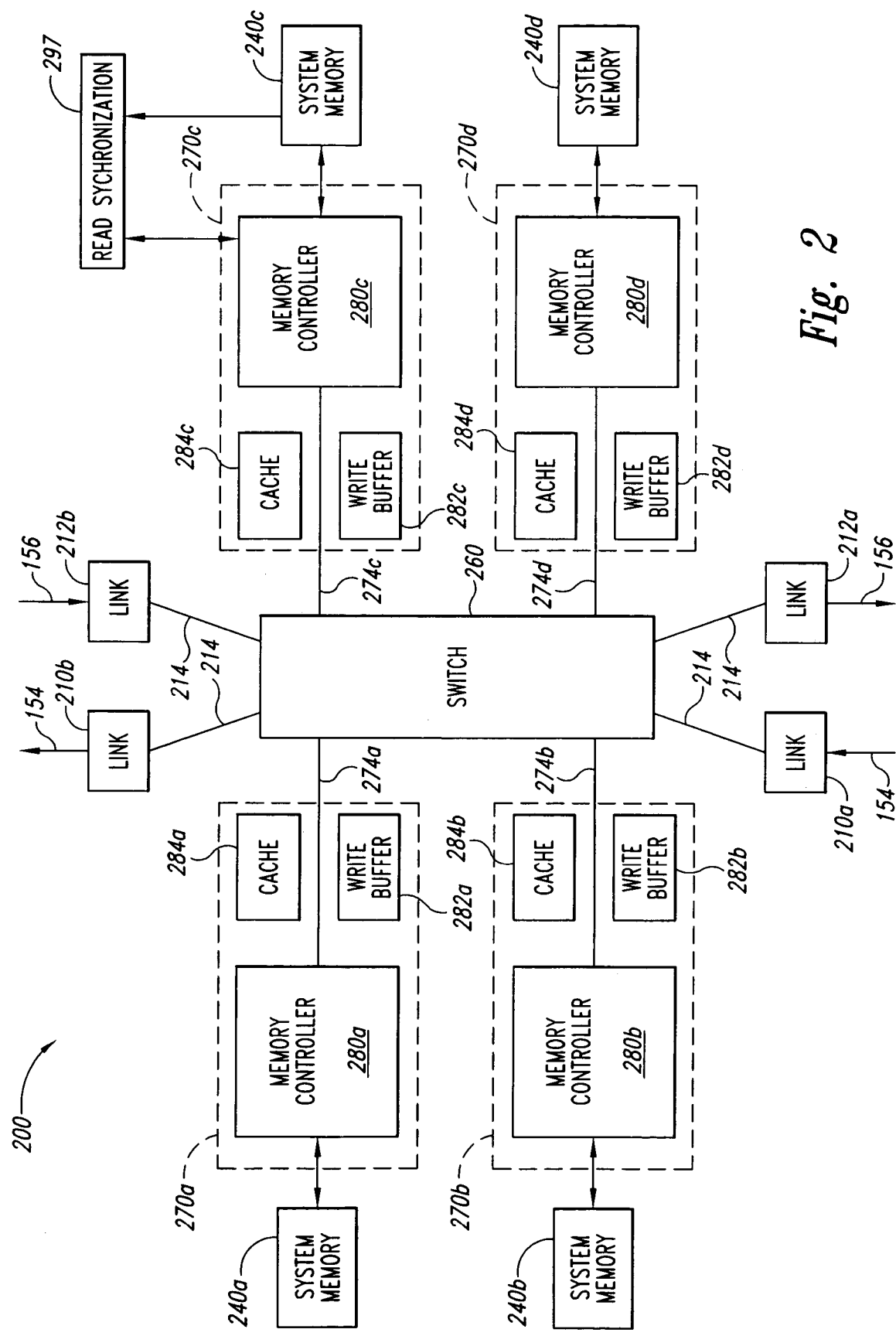
FIG. 2 is a partial block diagram of a memory hub used in the computer system of FIG. 1, which contains read synchronization modules according to an embodiment of the present invention.

FIG. 2 illustrates a memory hub 200 in which an embodiment of the present invention is implemented. The memory hub 200 can be substituted for the memory hub 140 of FIG. 1. The memory hub 200 is shown in FIG. 2 as being coupled to system memory 240a-d. The system memory 240a-d is representative of different types of memory devices and different numbers of memory devices. For example, in one embodiment, each system memory 240a-d represents a conventional double data rate (DDR) synchronous dynamic random access memory (SDRAM) device. In an alternative embodiment, each of the system memory 240a-d represents a bank of memory having a plurality of memory devices. It will be appreciated that the necessary modifications to the memory hub 200 to accommodate the different types and number of memory devices is within the knowledge of those ordinarily skilled in the art, and will not be discussed herein in the interest of brevity.

Further included in the memory hub 200 are link interfaces 210a, 210b and 212a, 212b for coupling the memory module on which the memory hub 200 is located to the bus system 134. The link interfaces 210a, 210b are coupled to the downstream bus 154 and the link interfaces 212a, 212b are coupled to the upstream bus 156. The link interfaces 210a, 210b and 212a, 212b are conventional, and include conventional circuitry used for transferring data, command, and address information to and from the downstream and upstream busses 154, 156. The link interfaces 210a, 210b and 212a, 212b are coupled to a switch 260 through a plurality of bus and signal lines, represented by busses 214. The busses 214 are conventional, and include a write data bus and a read data bus, although a single bi-directional data bus may alternatively be provided to couple data through the link interfaces 210a, 210b and 212a, 212b.

The switch 260 coupling the link interfaces 210a-d, 212a-d and the memory interfaces 270a-d can be any of a variety of conventional or hereinafter developed switches. For example, the switch 260 can be a conventional cross-bar switch that can simultaneously couple link interfaces 210a, 210b and 212a, 212b and the memory interfaces 270a-d to each other in a variety of arrangements. The switch 260 may also include arbitration logic (not shown) to determine which memory accesses should receive priority over other memory accesses. Bus arbitration performing this function is well known to one skilled in the art. The switch 260 is further coupled to four memory interfaces 270a-d which are, in turn, coupled to the system memory 240a-d, respectively. The switch 260 is coupled to each memory interface through a plurality of bus and signal lines, represented by busses 274. The busses 274 include a write data bus, a read data bus, and a request line.

The memory interfaces 270a-d are adapted to the system memory 240a-d to which it is coupled. More specifically, the memory interfaces 270a-d are specially adapted to provide and receive the specific signals received and generated, respectively, by the system memory 240a-d to which it is coupled. Also, the memory interfaces 270a-d are capable of operating with system memory 240a-d operating at different clock frequencies. As a result, the memory interfaces 270a-d isolate the processor 104 from changes that may occur at the interface between the memory hub 230 and memory devices 240a-d coupled to the memory hub 200, and provide a more controlled environment to which the memory devices 240a-d may interface.

With further reference to FIG. 2, each of the memory interfaces 270a-d includes a respective memory controller 280, a respective write buffer 282, and a respective cache memory unit 284. The memory controller 280 performs the same functions as a conventional memory controller by providing control, address and data signals to the system memory device 240a-d to which it is coupled and receiving data signals from the system memory device 240a-d to which it is coupled. The write buffer 282 and the cache memory unit 284 include the normal components of a buffer and cache memory, including a tag memory, a data memory, a comparator, and the like, as is well known in the art. The write buffer 282 in each memory interface 270a-d can be used to store write requests while a read request is being serviced. The cache memory unit 284 in each memory interface 270*a-d* allows the processor 104 to receive data responsive to a read command directed to a respective system memory 240*a-d* without waiting for the system memory 240*a-d* to provide such data in the event that the data was recently read from or written to that memory device 240*a-d*.

Embodiments of the present invention provide a read synchronization module 297 for determining timing margin between when read data is provided by the system memory 240 and when the read data is retrieved by the memory controller 280. Typically, the read data is provided according to a memory device clock signal and the read data retrieved according to a core clock signal that has a lower frequency than the memory device clock signal. Based on the timing margin determined by the read synchronization module 297, various timing parameters between the memory controller 280 and the system memory 240 can be adjusted. For example, the memory synchronization module 297 can be used to synchronize the coupling of read data from the memory device with the core clock domain of the memory hub 200 as established by a system clock signal from the memory hub controller 128. By having the memory synchronization module 297 adjust for timing drift of the read strobe signal and read data relative to the core clock signal, it may be possible to eliminate DLL circuitry from the memory device since the memory synchronization module 297 tracks when read data is latched by the memory controller 280 and when the read data is available for reading, and if necessary, adjusts the latching and the reading of the data to accommodate for the timing drift.

Although a single synchronization module 297 is shown in FIG. 2, it is to be understood that a plurality of synchronization modules 297 may also be used, for example, one per memory controller 280. Further, in the embodiment shown in FIG. 2, the synchronization module 297 is shown in communication with the memory device 240*c* and the memory controller 280*c*. In some embodiments, the synchronization module 297 may be in communication with one or more memory devices and the controller 100 or memory hub 140 shown in FIG. 1. It will be further appreciated that the read synchronization module 297 may be included as part of the memory controller 280, although shown in FIG. 2 as a separate functional block.

Figure 3:
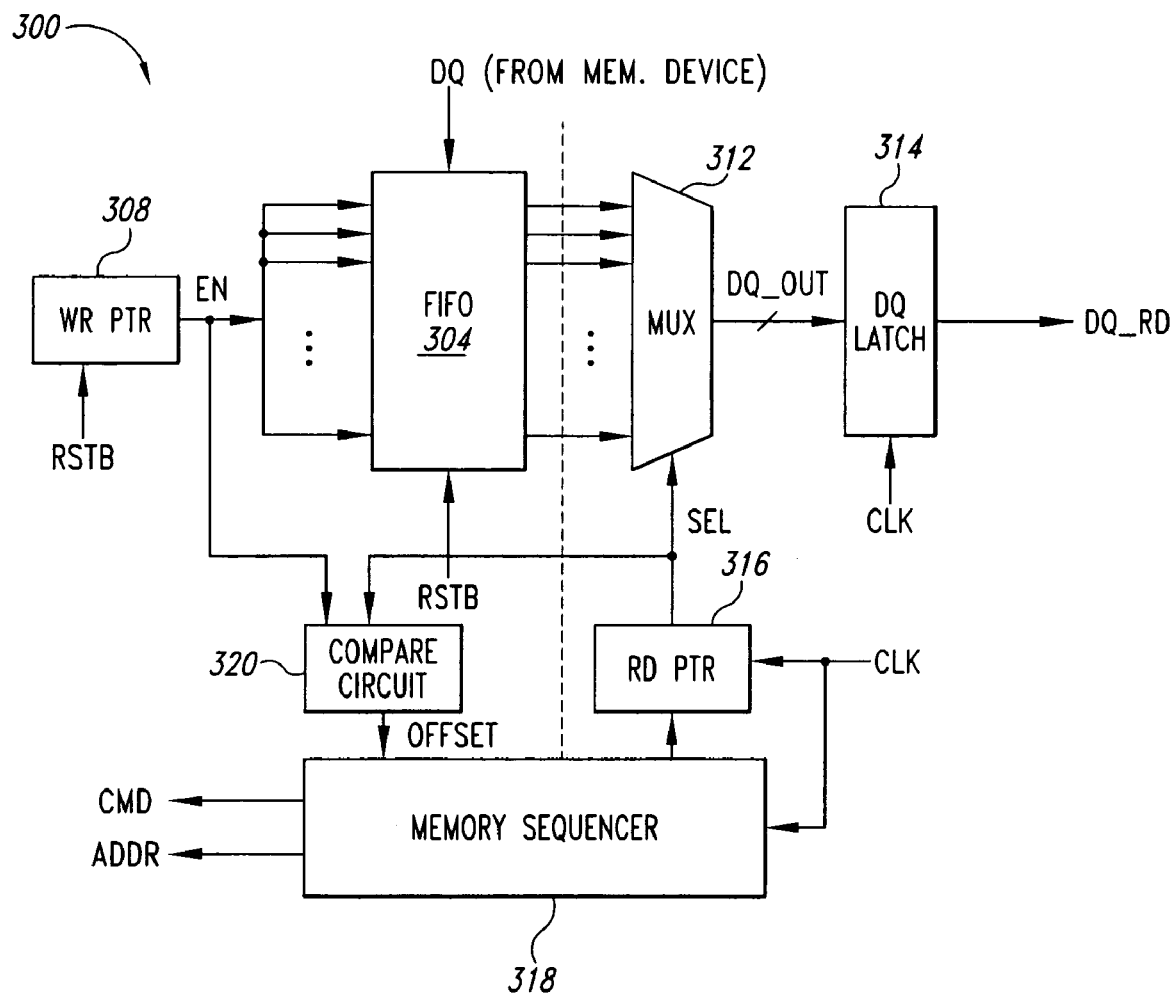
FIG. 3 a partial block diagram of a read synchronization circuit according to an embodiment of the present invention.

FIG. 3 illustrates a read data synchronization circuit 300 according to an embodiment of the present invention. The read data synchronization circuit 300 can be substituted for the read data synchronization circuit 297 shown in FIG. 2. The read data synchronization circuit 300 shown in FIG. 3 is operable for one bit of the read data. The functional blocks shown in FIG. 3 should be generally repeated for every bit of the read data. It will be appreciated, however, that it may not be necessary for some functional blocks to repeated. Those ordinarily skilled in the art will obtain sufficient understanding from the description provided herein in order to practice the present invention.

The read data synchronization circuit 300 provides for coupling read data across two clock domains, namely coupling read data from the system memory 240 operating according to a memory clock signal and the memory hubs 140 operating according to a core clock signal. Typically, the frequency of the memory clock signal is greater than the frequency of the core clock signal. As shown in FIG. 3, the core clock signal is represented by the CLK signal and the memory clock signal is represented by the RSTB signal. The RSTB signal is a read strobe signal that is transmitted by the system memory 240 along with the read data as an indication that read data is being transmitted, as known in the art. Although the RSTB signal is not the actual memory clock signal, the RSTB signal has a timing relative to, and the same frequency as, the memory clock signal. Thus, when the RSTB signal is clocking, it essentially clocks in time with the memory clock signal. As explained in more detail below, the RSTB signal is used to synchronize read data capture.

The read data synchronization circuit 300 includes a data buffer 304. The buffer 304 is conventional, and can be configured as a first-in-first-out (FIFO) buffer. The buffer 304 includes n data locations for storing up to n data. The buffer 304 is coupled to receive the RSTB signal in order to capture data in response to each clock transition of the RSTB signal. The buffer 304 is further coupled to a write pointer circuit 308. In response to the RSTB signal, the write pointer circuit 308 provides an enable signal EN to the buffer 304 to selectively enable one of the n data locations to which memory read data DQ is to be written. For each transition of the RSTB signal, the write pointer circuit 308 disables the current data location and enables a next data location of the FIFO to which the next memory read data DQ is to be written. In this manner, the data locations of the buffer 304 are incremented through in response to each transition of the RSTB signal so that as new memory read data DQ is provided to the buffer 304, each memory read data DQ is captured at one of the n data locations of the buffer 304 in response to the RSTB signal that is provided with the memory read data DQ. By using the EN signal to select which one of the n data locations to write the memory read data DQ, the EN signal provides a "write pointer" that "points" to the data location in the buffer 304 that memory read data DQ is to be written.

The write pointer circuit 308 operates the buffer 304 as a circular buffer in that after n memory read data DQ are written to the n data locations, the n+1 memory read data DQ will overwrite the memory read data DQ written to a first data location of the buffer 304. Consequently, it is desirable for the memory read data DQ at the first data location to have been retrieved before being overwritten. It will be appreciated that the number of data locations of the buffer 304 should be sufficient to prevent new memory read data DQ written to the buffer 304 according to the memory clock signal from overwriting memory read data DQ already written to the buffer 304, but not yet retrieved according to a lower frequency core clock signal CLK.

A multiplexer 312 is coupled to the buffer 304 to select m of the n data locations and provide the data stored in the m selected data locations as output data DQ_OUT. The output data DQ_OUT is coupled to a latch circuit 314, which latches the m output data DQ_OUT in response to the rising edge of the core clock signal CLK and provides the data as read data DQ_RD. Selection by the multiplexer 312 is based on a selection signal SEL provided by a read pointer circuit 316 that is coupled to the multiplexer 312 and the memory controller 280 (FIG. 2). It will be appreciated by those ordinarily skilled in the art that the SEL signal is indicative of the data locations of the buffer 304 from which data is selected for provision by the multiplexer 312 as output data DQ_OUT. As a result, the SEL signal provides a "read pointer" that "points" to the data locations in the buffer 304 from which data is read. As previously discussed, the memory controller 280 provides memory device command signals CMD and memory address signals ADDR to the system memory 240. The memory sequencer further enables the read pointer circuit 316 at a time relative to sending a read command to the system memory 240 in order to select from the buffer 304 m memory read data DQ to be provided as output data DQ_OUT.

When enabled by the memory controller 280, the read pointer circuit 316 increments through groups of m data locations of the buffer 304 in response to the core clock signal CLK. The multiplexer 312 selects m of the n data locations simultaneously in response to the CLK signal to accommodate the higher clock frequency of the memory clock signal relative to the frequency of the CLK signal. It will be appreciated by those ordinarily skilled in the art that the m number of data locations to be selected by the multiplexer 312 will be based on the number of memory read DQ provided by the system memory 280 for every clock cycle of the CLK signal.

The read data synchronization circuit 300 further includes a compare circuit 320 that is coupled to the write pointer circuit 308 and the read pointer circuit 316. The compare circuit 320 compares the EN and SEL signals to determine an offset between the data location of the buffer 304 to which memory read data DQ is written and the data locations of the buffer 304 from which data is provided by the multiplexer 312 as output data DQ_OUT. That is, with reference to the previous discussion of write and read pointers, the compare circuit 320 determines the offset between the write pointer and the read pointer. A signal OFFSET indicative of the offset between the write and read pointers is generated by the compare circuit 320 and provided to the memory controller 280. As will be explained in more detail below, the offset between the write and read pointers determined by the compare circuit 318 can be used by the memory controller 280 to gauge timing margins, and if appropriate, adjust timing parameters such as to reduce read latency and command turn-around times.

Operation of the read data synchronization circuit 300 will be described with respect to a conventional "burst" read operation for a DDR memory device. As well known, when a burst read operation in a DDR memory device is performed, a first data is provided after a time delay from the latching of a column address by the memory device. Thereafter, new data is provided in response to each transition of a memory clock signal applied to the DDR memory device until the burst operation is terminated. Thus, for each period of the memory clock signal, the DDR memory device outputs data twice, that is, once in response to a rising edge of the memory clock signal and again in response to a falling edge of the memory clock signal.

In operation, the buffer 304 and the multiplexer 312 function to de-serialize the memory read data DQ received from the system memory 240 in accordance with the memory device clock signal to be provided in parallel from the multiplexer 312 according to the core clock signal CLK. The memory controller 280 transmits CMD and ADDR signals to the memory devices 148 in order to execute a burst read operation. At the time the burst read operation is initiated, the write pointer of the write pointer circuit 308 and the read pointer of the read pointer circuit 316 are pointing to the same data location of the buffer 304. Based on the CMD and ADDR signals, the system memory 240 access the memory cell locations corresponding to the ADDR signals to retrieve the requested read data, and provide the requested read data to the buffer 304 as memory read data DQ. Since the present example is directed to a burst read operation, new memory read data DQ is provided to the buffer 304 in response to each transition of the memory clock signal. As previously discussed, the system memory 240 transmits a RSTB signal with each memory read data DQ provided to the buffer 304. In the case of a burst read operation, the RSTB signal clocks between two logic levels at the same frequency as the memory clock signal. Consequently, the write pointer circuit 308 sequentially enables data locations in the buffer 304 in response to each transition of the RSTB signal in order to capture the memory read data DQ provided to the buffer 304 in response to each transition of the memory clock signal.

At a time following the initiation of the burst read operation, the memory controller 280 enables to read pointer circuit 316 to provide a SEL signal to the multiplexer 316 to select groups of m data locations of the buffer 304 for provision as the output data DQ_OUT. The time typically corresponds to t number of clock cycles of the core clock signal CLK after the burst read operation was initiated by the CMD and ADDR signals. In response to the t-th rising edge of the CLK signal, m data locations of the buffer 304 are selected by the multiplexer 312, the data stored therein provided as the output data DQ_OUT, and latched by the latch circuit 314 for provision as read data DQ_RD. For every rising edge of the CLK signal thereafter, a next group of m data locations of the buffer 304 are selected so that the data stored therein are provided as the output read data DQ_OUT and latched by the latch circuit 314. The process of selecting a next group of m data locations of the buffer 304 and latching the data stored in the selected data locations at the latch 314 continues until the last read data of the burst operation is provided as read data DQ_RD. When the last of the read data is read from the buffer 304, the read pointer would have finally caught up to the write pointer.

During the time the write pointer is incrementing, which is representative of the memory read data DQ being written to sequential data locations of the buffer 304 according to the memory clock signal, and the read pointer is incrementing, which is representative of the groups of m data locations being selected by the multiplexer 312 according to the core clock signal CLK, a relative offset between the write pointer and the read pointer can be determined by the compare circuit 320. It will be appreciated that the write and read pointer offset, which is the number of data locations of the buffer 304 between the data location to which the write pointer points and the data location to which the read pointer points, is representative of the timing margin between when read data DQ is made available in the buffer 304 and when the data is selected by the multiplexer 312 for reading. As previously mentioned, it may be advantageous for the timing margins to be adjusted based on the write and read pointer offset, such as for accommodating timing drift, exploiting extra timing margin to reduce read latency, or reducing memory device command turn-around times.

For example, based on the OFFSET signal generated by the compare circuit 318, which is indicative of the offset between the write and read pointers, the memory controller 280 can adjust the timing of when the multiplexer 312 selects a group of m data from the buffer 304 to be provided as DQ_OUT relative to when the memory read data DQ is written to the FIFO 204. This may be desirable in the event that timing drift causes the offset to be relatively small, indicating that the data selected by the multiplexer 312 from the buffer 304 is occurring too soon after the memory read data DQ is written to the buffer 304. It may be desirable to reduce the potential for error resulting from reading data from the buffer 304 before the requested data is actually written to the buffer 304 by having the read pointer circuit 316 and multiplexer 312 select from the buffer 304 at a relatively later time. As a result, the timing of when memory read data DQ is written to the buffer 304 and when the data is selected to be provided as output data DQ_OUT is increased to relax the timing margin. The timing margin can be relaxed by having the memory controller 280 wait an additional clock cycle of the CLK signal before enabling the read pointer circuit 316 to select data from the buffer 304. Similarly, it will be appreciated that the timing of when memory read data DQ is written to the buffer 304 and when the data is selected to be provided as output data DQ_OUT can be decreased to tighten the timing margin where the write and read pointer offset is relatively large, thus reducing read latency.

Additionally, the write and read pointer offset can be used to monitor the memory device command turn-around time. The command turn-around time is representative of the minimum time required between the issuance of a first memory device command and the issuance of a second memory device command. For example, the read-write command turn-around time is the minimum time required after the issuance of a read command before a write command to the same memory device can be issued. The turn-around time includes not only the time necessary for the read command to be transmitted to the memory device and the read data to be obtained after receiving the read command and memory addresses. The read-write turn-around time also includes the time necessary for the read data to be transmitted back on a bidirectional memory device data bus coupled between the memory device and a memory controller, such as a memory hub. That is, in order to avoid a data collision, the write data of the immediately following write command cannot be transmitted on the memory device data bus until the read data is received by the memory controller. Typically, the minimum read-write turn-around time is determined based on a "worst case" scenario where all of the timing parameters are assumed to be the longest allowable time within specification. Based on the write and read pointer offset, however, the "worst case" assumption can be refined to reduce the minimum read-write turn-around time if possible. That is, if the write and read pointer offset is relatively large, indicating that the read data DQ is written to the buffer 304 relatively sooner in time than expected, the memory controller 280 can issue a write command relatively sooner in time after issuing a read command to take advantage of the extra timing margin rather than waiting for the worst-case read-write turn-around time to elapse. For example, the write command can be issued one clock cycle of the CLK signal sooner. It will be appreciated by those ordinarily skilled in the art that analysis of the write-read turn-around time can also be refined from the worst-case scenario through the use of the write and read pointer offset as well.

It will be appreciated that adjustment of timing parameters in the memory system can occur whenever desired. However, the timing parameters are typically adjusted during a time when there are no memory requests pending in order to avoid negatively affecting any memory operations currently in progress. For example, adjustment can be made during a refresh operation for a memory device. During this time, as known in the art, there are no memory operations currently in progress, and adjustment of timing parameters can be made without interference.

The previously discussed examples illustrate the usefulness of embodiments of the present invention. In the first example, the write and read pointer offset was used by the memory controller 280 to adjust the timing of when to retrieve read data from the buffer 304 relative to the issuance of a read command. In the second example, the write and read pointer offset was used by the memory controller 280 to adjust the time of when a subsequent memory device command is issued relative to the issuance of the previous memory device command. It will be appreciated that the information provided by the write and read pointer offset, which can be used more generally to gauge various timing margins of a system including a memory controller and memory device, can be used to adjust timing parameters in addition to the ones previously described. Consequently, the scope of the present invention should not be limited to the specific embodiments described herein.

Figure 4:
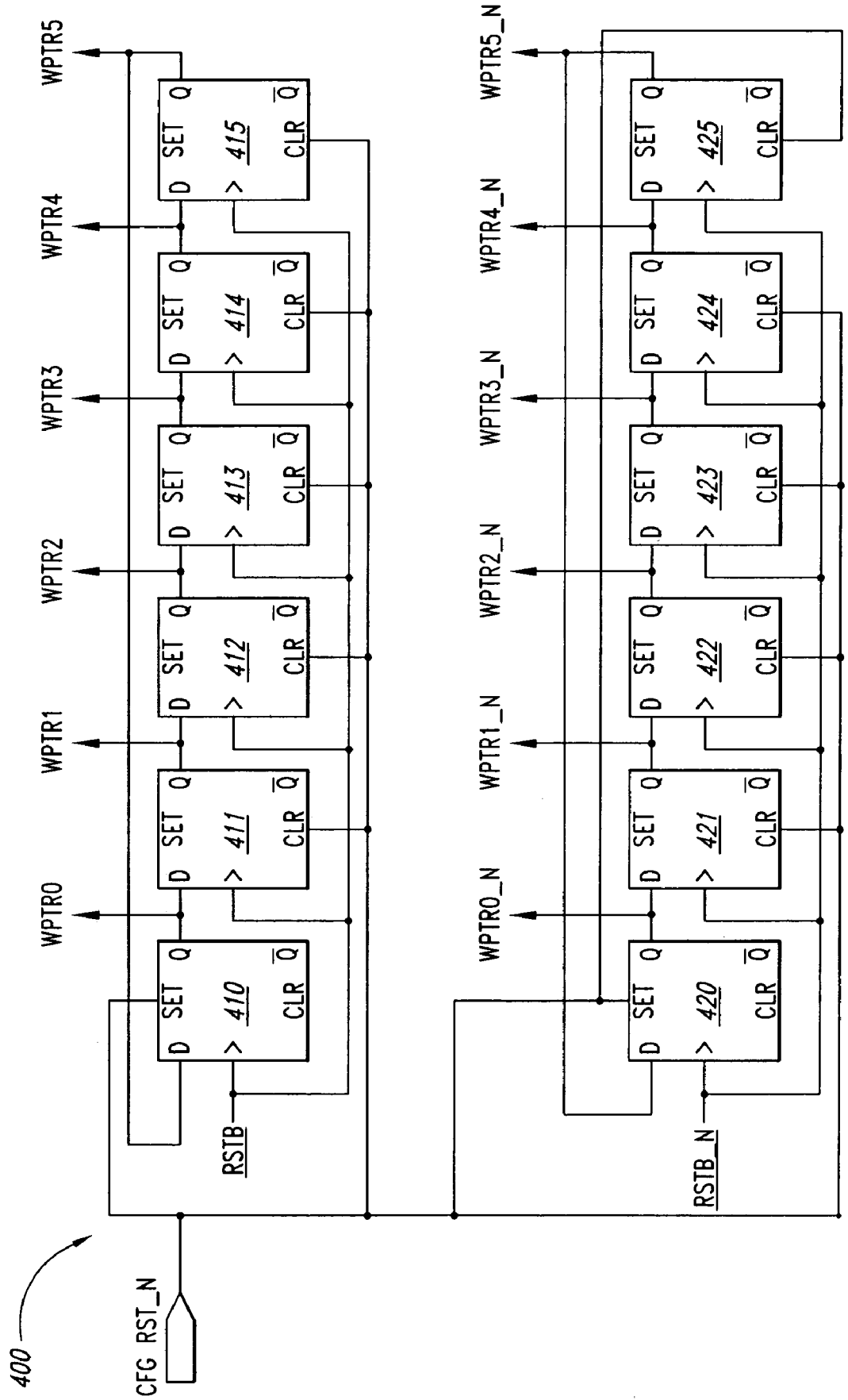
FIG. 4 is a partial block diagram of a write pointer circuit according to an embodiment of the present invention that may be substituted into the read synchronization circuit of FIG. 3.

FIG. 4 illustrates a write pointer circuit 400 according to an embodiment of the present invention. The write pointer circuit 400 can be substituted for the write pointer circuit 308 in FIG. 3. The write pointer circuit 400 includes a first set of series coupled D flip-flops 410-415 clocked according the RSTB signal and further includes a second set of series coupled D flip-flops 420-425 clocked according to the complementary RSTB signal, RSTB_N. The output of the last D flip-flop 415, 425 of each set is coupled back to the input of the first D flip-flop 410, 420, respectively, of the same set. A tap at the output of each of the D flip-flops 410-415 and 420-425 provide an enable signal for a respective data location of a buffer (not shown). As shown in FIG. 4, the write pointer circuit 400 can be used with a buffer having 12 data locations in which to store memory read data, and with a DDR memory device that can provide output data in response to each edge of a memory clock signal. The D flip-flops 410-415 provide enable signals for enabling the even numbered data locations (i.e., location 0, location 2, location 4, etc.) of the buffer and the D flip-flops 420-425 provide enable signals for enabling the odd numbered data locations (i.e., location 1, location 3, location 5, etc.).

In operation, the D flip-flops 410-415 and 420-425 are reset and initialized by an active HIGH reset signal CFGRST_N. When reset, the D flip-flop 410 is set to output a "1" at the next rising edge of the RSTB signal and the D flip-flop 420 is set to output a "1" at the next rising edge of the RSTB_N signal, which coincides with the next falling edge of the RSTB signal. Thus, at the rising edge of the RSTB signal following the HIGH CFGRST_N signal the WPTR0 signal switches from a "0" to a "1," and at the following falling edge of the RSTB signal (i.e., the next rising edge of the RSTB_N signal) the WPTR0_N signal switches from a "0" to a "1." At the next rising edge of the RSTB signal, the D flip-flop 411 latches the "1" at the output of the D flip-flop 410 and the output of the D flip-flop 411 switches from a "0" to a "1." Additionally, since the input of the first D flip-flop 410 is coupled to the output of the last D flip-flop 415, which was reset to a "0" in response to the HIGH CFGRST_N signal, the output of the first D flip-flop 410 switches from a "1" to a "0" in response to the same rising edge of the RSTB signal. Thus, the WPTR1 signal switches from a "0" to a "1" and the WPTR0 signal switches form a "1" to a "0" in response to the rising of the RSTB signal. At the next falling edge of the RSTB signal, the D flip-flop 421 latches the "1" at the output of the D flip-flop 420 and the output of the D flip-flop 421 switches from a "0" to a "1." Additionally, since the input of the first D flip-flop 420 is coupled to the output of the last D flip-flop 425, which was reset to a "0" in response to the HIGH CFGRST_N signal, the output of the first D flip-flop 420 switches from a "1" to a "0" in response to the same falling edge of the RSTB signal. Thus, the WPTR1_N signal switches from a "0" to a "1" and the WPTR0_N signal switches from a "1" to a "0" in response to the falling edge of the RSTB signal.

As the RSTB signal continues to clock back and forth, a "1" is shifted through the D flip-flops 410-415 every rising edge of the RSTB signal and a "1" is shifted through the D flip-flops 420-425 every falling edge of the RSTB signal. The arrangement of each set of D flip-flops 410-415, 420-425 can be referred to as a "one-hot" arrangement. That is, only one of the D flip-flops of each set 410-415, 420-425 is "hot," or outputs a "1," in response to the respective RSTB edge. Consequently, the output signal at each of the D flip-flops 410-415, 420-425 can be used as the EN signal (FIG. 3) to sequentially enable and disable the data locations of a buffer (not shown) in accordance with each clock edge of the RSTB signal, as previously described with respect to the write pointer circuit 308 of the read data synchronization circuit 300.

Figure 5:
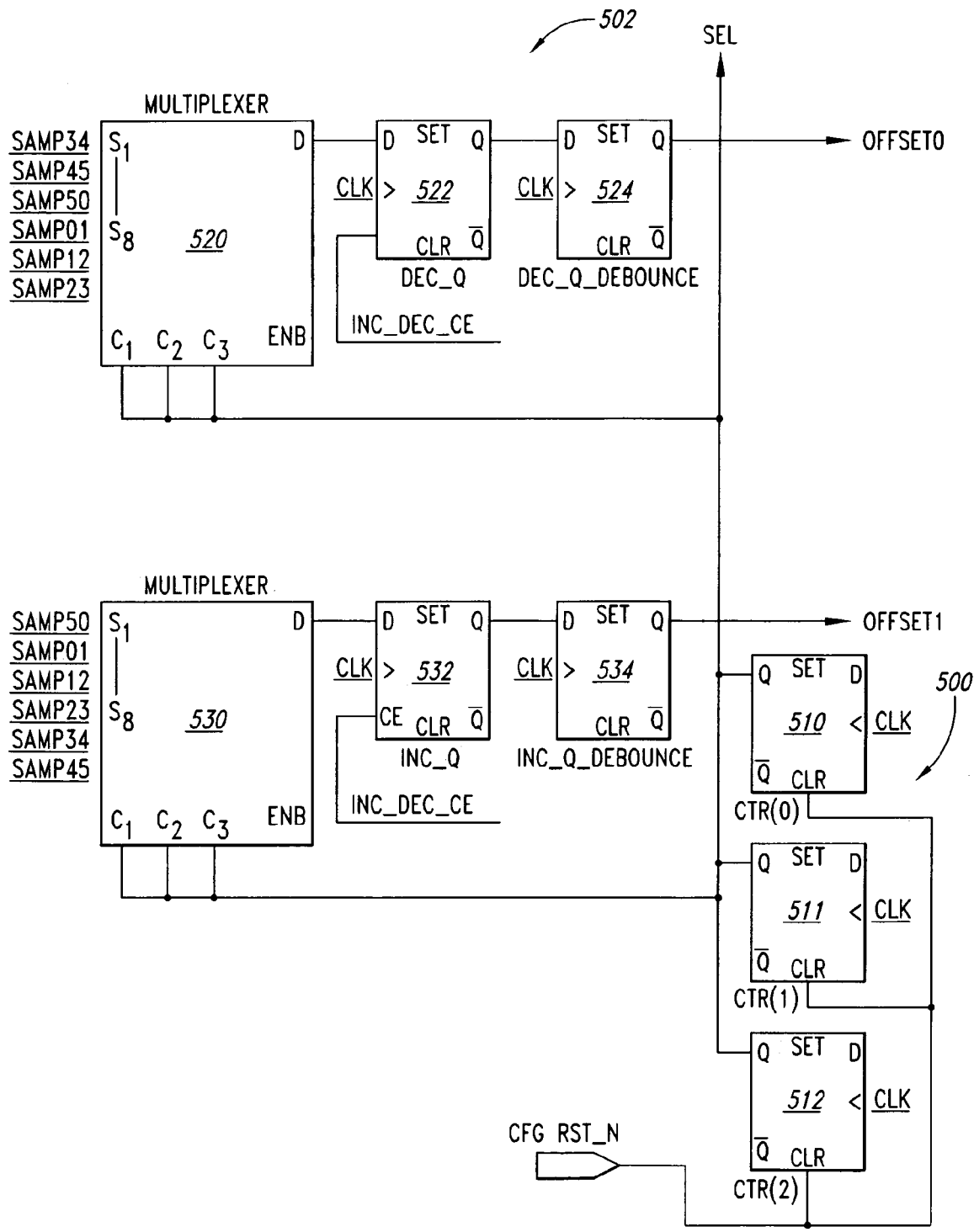
FIG. 5 is a partial block diagram of a read pointer circuit and a portion of a compare circuit according to embodiments of the present invention that may be substituted into the read synchronization circuit of FIG. 3.

FIG. 5 illustrates a read pointer circuit 500 and a portion of a compare circuit 502 according to an embodiment of the present invention. The read pointer circuit 500 includes three D flip-flops 510-512 clocked by a CLK signal, which can represent a core clock signal. The three bit output of the D flip-flops 510-512 can be used as the select signal SEL to control a multiplexer to sequentially select groups of m data locations of a buffer for provision as read data. Although not shown in FIG. 5, a conventional binary counter circuit can be coupled to the inputs of the D flip-flops 510-512 to provide an incrementing signal that is latched and output in response to each rising edge of the CLK signal. The counter circuit (not shown) can be included in a memory controller coupled to the read pointer circuit 500. As will be explained in further detail below, when used with the write pointer circuit 400 of FIG. 4, the conventional binary counter circuit coupled to the read pointer circuit 500 should rollover after a six count.

The outputs of the D flip-flops 510-512 are further coupled to multiplexers 520, 530 which represent a portion of the compare circuit 502. Each of the multiplexers 520, 530 receive a respective set of input signals SAMP01-SAMP50 from which each of the multiplexers select for output based on the SEL signal of the D flip-flops 510-512. The output of each of the multiplexers 520, 530 is coupled to a respective pair of series coupled D flip-flops 522, 524 and 532, 534. The two pairs of D flip-flops 522, 524 and 532, 534 are clocked by the CLK signal, and the output of the D flip-flops 524, 534 can be used as an OFFSET signal indicative of the write and read pointer offset. A flip-flop enable signal INC_DEC_CE provided to the D flip-flops 522, 532 is used to enable sampling of the write pointer. It will be appreciated that sampling of the write pointer can occur at any time when desired. However, sampling of the write pointer is typically enabled during burst memory operations, where the write and read pointer offset is a relatively stable value.

The pairs of D flip-flops 522, 524 and 532, 534 provide an arrangement that can be used to reduce instability of the OFFSET signal caused by the meta-stability of D flip-flops at the time input data is latched in response to a rising clock edge. That is, the first D flip-flops 522 and 532 may latch a transitional data value in response to the rising edge of the CLK signal since the input values to the multiplexers are changing according to the higher frequency memory clock signal. However, the second D flip-flops 524, 534 latch a stable output value provided at the output of the first D flip-flops 522, 532. The D flip-flops 510-512, 522, 524, 532, and 534, and the multiplexers 520, 530 are conventional.

Figure 6:
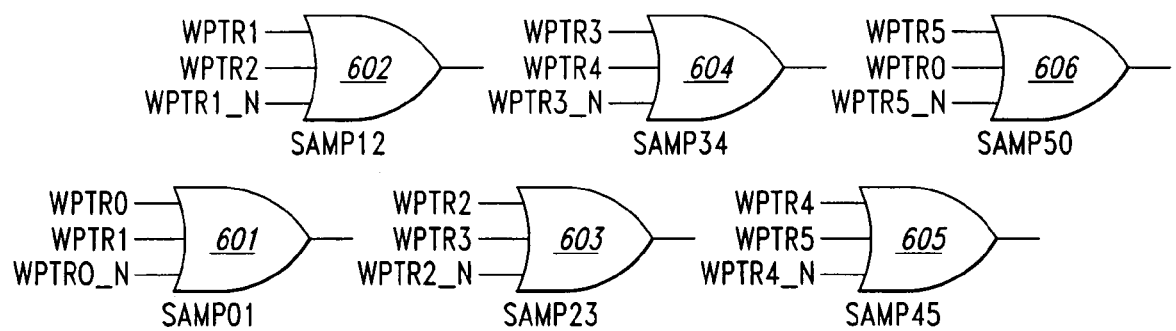
FIG. 6 is a partial block diagram of another portion of the a compare circuit of FIG. 5.

FIG. 6 illustrates another portion of the compare circuit 502 shown in FIG. 5. Six three-input OR logic gates 601-606 provide a respective one of the input signals SAMP01-SAMP50 that are coupled to the inputs of the multiplexers 520, 530. The inputs of each of the OR gates 601-606 are coupled to a different combination of the enable signals WPTR0-WPTR5, WPTR0_N-WPTR5_N provided by the write counter circuit 400 (FIG. 4). The OR gates 601-606 are conventional.

The read pointer circuit 500 and the compare circuit 502, including the OR gates 601-606, can be substituted for the read pointer 316 and the compare circuit 320 of the read data synchronization circuit 300. As will be explained in greater detail below, the write pointer circuit 400, the read pointer circuit 500, and the compare circuit 502 can be used together to determine a write and read pointer offset for a read data synchronization circuit having a buffer with 12 data locations and a multiplexer that selects groups of 4 data locations of the buffer for coupling to a latch circuit.

As previously discussed, the write pointer circuit 400 can be used to generate enable signals WPTR0-WPTR5, WPTR0_N-WPTR5_N for sequentially enabling one of twelve data locations of a buffer to which memory read data from a memory device is written. The write pointer circuit 400 operates according to the RSTB signal, which essentially clocks at the same frequency as a memory clock signal. The enable signals WPTR0-WPTR5, WPTR0_N-WPTR5_N are further coupled in various combinations to the input terminals of the OR gates 601-606. The OR gates 601-606 are used to generate signals that are indicative of the location of the write pointer. More specifically, the OR gates 601-606 generate signals indicative of the location of the "one-hot" bit for the D flip-flops 410-415 and 420-425. Based on the location of the one-hot bits, an indication of which data location the write pointer is pointing is provided.

For example, where the one-hot bit for the first set of D flip-flops 410-415 is located at the D flip-flop 411 following a rising edge of the RSTB signal, the output of the OR gates 601 and 602 will be HIGH, while the output of the remaining OR gates 603-606 will remain LOW. At a next falling edge of the RSTB signal, the one-hot bit for the D flip-flops 420-425 is located at the D flip-flop 421, causing in the outputs of the OR gates 601 and 602 to remain HIGH and the outputs of the remaining D flip-flops 603-606 remain LOW. In response to the next rising edge of the RSTB signal, the one-hot bit of the D flip-flops 210-215 moves to the D flip-flop 412. As a result, the output of the OR gate 601 switches LOW, the output of the OR gate 602 remains HIGH, and the output of the OR gate 603 switches HIGH. The OR gates 604-606 remain LOW. At the next falling edge of the RSTB signal, the one-hot bit for the D flip-flops 420-425 moves to the D flip-flop 422. The outputs of the OR gates 602 and 603 remain HIGH, and the outputs of the remaining OR gates 601 and 604-606 remain LOW. At the next rising edge of the RSTB signal, the one-hot bit of the D flip-flops 410-415 moves to the D flip-flop 413, causing the output of the OR gate 602 to switch LOW and the output of the OR gate 604 to switch HIGH. The output of the OR gate 603 remains HIGH and the outputs of the remaining OR gates 601, 602, 605, 606 remain LOW. As demonstrated by the present example, the location of the one-hot bits of the D flip-flops 410-415, 420-425 is represented by which two of the six OR gates 601-606 has HIGH output signals. Generally, a first of the two OR gates having a HIGH output identifies the "trailing" D flip-flop at which the one-hot bit is currently located or was just previously located, and a second of the two OR gates identifies the "leading" D flip-flop at which the one-hot bit is currently located or will soon be located.

The one-hot arrangement of the D flip-flops 410-415 and 420-425 facilitates determination of the write and read pointer offset by avoiding potential sampling errors present with an encoded write pointer scheme. An encoded scheme digitally encodes a value corresponding to the data location to which memory read data is written. For example, when using a three-bit encoded write pointer, pointing to the fourth data location of the 12-data location buffer is represented by 011. In response to the next clock transition of the RSTB signal, the write pointer will increment to 100. Due to the meta-stability of D flip-flops when transitioning in response to a rising edge of a clock signal, sampling at the time the encoded write pointer value is incrementing from 011 to 100 may result in detecting an erroneous write pointer value, such as 111. In contrast, with a one-hot arrangement, any ambiguity as to the location of the write pointer is reduced by having only one "hot" bit in the D flip-flops 410-415, 420-425 to represent the write pointer. It will be appreciated, however, that the advantages of a one-hot arrangement over an encoded arrangement does limit the scope of the present invention. Encoded pointer schemes, such as Gray codes, as well as other pointer schemes, can be used without departing from the scope of the present invention.

The read pointer circuit 500 generates selection signal SEL for a multiplexer (not shown) that selects groups of four data locations of the 12-data location buffer in accordance with the CLK signal. The SEL signal is further used to sequentially select which of the six input signals from the OR gates 601-606 are coupled as a respective output signal of the multiplexers 520, 530. The respective outputs of the multiplexers 520, 530 are latched in response to the rising edge of the CLK signal by the D flip-flops 522, 532, and on the next rising edge of the CLK signal by the D flip-flops 524, 534 to provide an OFFSET signal. By sequencing through the input signals provided by the OR gates 601-606, and latching the output at the D flip-flops 522, 532, and 524, 534, all in response to the rising edges of the CLK signal, the OFFSET signal provided by the D flip-flops 524, 534 is indicative of the write and read pointer offset.

As previously discussed, the memory controller 280 (FIG. 3) receives the OFFSET signal from the compare circuit and uses the write and read pointer offset to determine whether timing parameters should be adjusted. For example, based on the write and read pointer offset, the memory controller 280 can determine whether the timing between issuance of a read command and when the data locations of the buffer are selected for providing the read data should be adjusted to relax or tighten the timing margin. Additionally, based on the write and read pointer offset, analysis of the timing between the issuance of a first memory command and a second memory command can be refined and modified to reduce command turn-around times if desirable.

From the foregoing it will be appreciated that, although specific embodiments of the invention have been described herein for purposes of illustration, various modifications may be made without deviating from the spirit and scope of the invention. For example, embodiments of the present invention have been described herein with respect to implementation in a memory hub. However, it will be appreciated that the present invention can be used more generally in non-memory hub memory controllers without departing from the scope of the present invention. Thus, alternative embodiments of the present invention include a non-memory hub memory controller having a read data synchronization circuit. Accordingly, the invention is not limited except as by the appended claims.

What is claimed is:

1. A memory hub, comprising:
    a link interface receiving memory requests for access to memory locations in at least one memory device;
    a memory device interface adapted to couple memory requests to memory devices for access to at least one of the memory devices and to receive read data responsive to at least some of the memory requests;
    a memory controller coupled to the link interface and the memory device interface, the memory controller adapted to couple memory requests to the memory device interface responsive to memory requests received from the link interface responsive to a core clock signal, the memory controller further adapted to adjust the timing at which read memory requests are coupled to the memory device interface responsive to a write-read pointer offset signal; and
    a read data synchronizing circuit coupled to the memory device interface, the read synchronization module, and the memory controller, the read data synchronizing circuit coupling read data from the memory devices operating according to a memory device clock signal to the memory controller, the read data synchronizing circuit comprising:
        a data buffer coupled to the memory device and having a plurality of data locations at which read data are respectively stored;
        a multiplexer coupled to the data buffer to selectively couple read data stored at respective data locations of the data buffer to an output terminal in accordance with a selection signal;
        a write pointer circuit coupled to the memory device and the data buffer and adapted to generate a write pointer signal to sequentially select one of the plurality of data locations of the data buffer for storing read data received from the memory device responsive to a strobe signal provided by the memory device;
        a read pointer circuit coupled to the multiplexer and adapted to generate responsive to the core clock signal a read pointer signal provided to the multiplexer to sequentially select one of the plurality of data locations of the buffer from which the read data stored therein is coupled to the output terminal of the multiplexer; and
        a write-read pointer compare circuit coupled to the write and read pointer circuits to compare the write and read pointer signals and adapted to generate and provide the write-read pointer offset signal indicative of the comparison to the memory controller.

2. The memory hub of claim 1 wherein the memory controller is further adapted to adjust the timing at which a write memory request immediately following a read memory request is coupled to the memory device interface responsive to the write-pointer offset signal.

3. The memory hub of claim 1 wherein the memory controller is further adapted to adjust the timing at which a read memory request immediately following a write memory request is coupled to the memory device interface responsive to the write-pointer offset signal.

4. The memory hub of claim 1 wherein the read data synchronizing circuit further comprises a data latch coupled to the output terminal of the multiplexer to latch the read data selectively coupled thereto responsive to the core clock signal.

5. The memory hub of claim 1 wherein the read pointer circuit of the read data synchronizing circuit comprises a plurality of flip-flops adapted to output a respective bit of a count value in response to the core clock signal.

6. The memory hub of claim 5 wherein the write pointer circuit of the read data synchronizing circuit comprises:
    a first set of series coupled flip-flops having an output of a last flip-flop coupled to an input of a first flip-flop, the first set of series coupled flip-flops shifting a flag through each flip-flop in response to a rising edge of the strobe signal; and
    a second set of series coupled flip-flops having an output of a last flip-flop coupled to an input of a first flip-flop, the second set of series coupled flip-flops shifting a flag through each flip-flop in response to a falling edge of the strobe signal, the write pointer signal represented by output signals of the flip-flops of the first and second sets of series coupled flip-flops.

7. The memory hub of claim 6 wherein the write-read compare circuit comprises:
   a logic circuit having a plurality of input nodes coupled to outputs of each flip-flop of the first and second sets of series coupled flip-flops and further having a plurality of output nodes, the logic circuit adapted to generate flag signals at each of the output nodes indicative of the location of the flag in the first and second sets of series coupled flip-flops;
   a first multiplexer having a plurality of input terminals coupled to the plurality of output nodes of the logic circuit, a selection terminal coupled to the read pointer circuit, and further having an output terminal, the first multiplexer selectively coupling one of the input terminals to the output terminal according to the read pointer signal provided by the read pointer circuit; and
   a second multiplexer having a plurality of input terminals coupled to the plurality of output nodes of the logic circuit, a selection terminal coupled to the read pointer circuit, and further having an output terminal, the second multiplexer selectively coupling one of the input terminals to the output terminal according to the read pointer signal provided by the read pointer circuit,
   the outputs of the first and second multiplexers providing signals representative the write-read pointer offset signal.

8. The memory hub of claim 7 wherein the logic circuit comprises a plurality of three-input logic OR gates, each logic OR gate having first and second inputs coupled to outputs of two flip-flops of the first set of series coupled flip-flops and further having a third input coupled to an output of a respective flip-flop of the second set of series coupled flip-flops.

9. The memory hub of claim 7 wherein the read data synchronizing circuit further comprises:
   a first pair of series coupled flip-flops coupled to the output terminal of the first multiplexer, the first pair of series coupled flip-flops shifting the output of the first multiplexer though the flip-flops in response to the core clock signal; and
   a second pair of series coupled flip-flops coupled to the output terminal of the second multiplexer, the second pair of series coupled flip-flops shifting the output of the second multiplexer though the flip-flops in response to the core clock signal.

10. A memory hub, comprising:
   a link interface receiving memory requests for access to memory locations in at least one memory device;
   a memory device interface adapted to couple memory requests to memory devices for access to at least one of the memory devices and to receive read data responsive to at least some of the memory requests;
   a memory controller coupled to the link interface and the memory device interface, the memory controller adapted to couple memory requests to the memory device interface responsive to memory requests received from the link interface responsive to a core clock signal, the memory controller further adapted to adjust the timing at which read memory requests are coupled to the memory device interface responsive to a write-read pointer offset signal; and
   a read data synchronizing circuit coupled to the memory device interface, the read synchronization module, and the memory controller, the read data synchronizing circuit coupling read data from the memory devices operating according to a memory device clock signal to the memory controller, the read data synchronizing circuit comprising:
      a data buffer having a plurality of memory locations at which to store data and a selection signal node, the data buffer coupled to the memory device to store read data at a respective one of the plurality of data locations selected in accordance with a selection signal;
      a write pointer circuit coupled to the memory device to receive a data strobe signal and further coupled to the selection signal node of the data buffer to provide a selection signal to sequentially select a data location to which read data from the memory device is written in response to the data strobe signal;
      a multiplexer having a plurality of input terminals coupled to a respective one of the plurality of data locations of the data buffer and further having an output terminal to which the input terminals are selectively coupled to couple read data from the data buffer to the output terminal according to a multiplexer selection signal applied to a multiplexer selection node;
      a read pointer circuit having a clock node to which the core clock signal is applied and further having an output node coupled to the multiplexer selection node to provide the multiplexer selection signal to sequentially select the input terminals for coupling to the output terminal of the multiplexer responsive to the core clock signal; and
      a pointer comparison circuit coupled to the write and read pointer circuits to compare to which one of the data locations read data received from the memory device are currently stored and from which one of the data locations read data are currently coupled to the output terminal of the multiplexer and generate a write-read pointer offset signal indicative of the comparison.

11. The memory hub of claim 10 wherein the memory controller is further adapted to adjust the timing at which a write memory request immediately following a read memory request is coupled to the memory device interface responsive to the write-pointer offset signal.

12. The memory hub of claim 10 wherein the memory controller is further adapted to adjust the timing at which a read memory request immediately following a write memory request is coupled to the memory device interface responsive to the write-pointer offset signal.

13. The memory hub of claim 10 wherein the data synchronizing circuit further comprises a data latch coupled to the output terminal of the multiplexer to latch the read data selectively coupled thereto responsive to the core clock signal.

14. The memory hub of claim 10 wherein the read pointer circuit of the data synchronizing circuit comprises a plurality of flip-flops adapted to output a respective bit of a count value in response to the core clock signal.

15. The memory hub of claim 14 wherein the write pointer circuit of the data synchronizing circuit comprises:
   a first set of series coupled flip-flops having an output of a last flip-flop coupled to an input of a first flip-flop, the first set of series coupled flip-flops shifting a flag through each flip-flop in response to a rising edge of the data strobe signal; and
   a second set of series coupled flip-flops having an output of a last flip-flop coupled to an input of a first flip-flop, the second set of series coupled flip-flops shifting a flag through each flip-flop in response to a falling edge of the data strobe signal, the selection signal represented by output signals of the flip-flops of the first and second sets of series coupled flip-flops.

16. The memory hub of claim 15 wherein the pointer comparison circuit comprises:
a logic circuit having a plurality of input nodes coupled to outputs of each flip-flop of the first and second sets of series coupled flip-flops and further having a plurality of output nodes, the logic circuit adapted to generate flag signals at each of the output nodes indicative of the location of the flag in the first and second sets of series coupled flip-flops;
a first multiplexer having a plurality of input terminals coupled to the plurality of output nodes of the logic circuit, a selection terminal coupled to the read pointer circuit, and further having an output terminal, the first multiplexer selectively coupling one of the input terminals to the output terminal according to the multiplexer selection signal provided by the read pointer circuit; and
a second multiplexer having a plurality of input terminals coupled to the plurality of output nodes of the logic circuit, a selection terminal coupled to the read pointer circuit, and further having an output terminal, the second multiplexer selectively coupling one of the input terminals to the output terminal according to the multiplexer selection signal provided by the read pointer circuit,
the outputs of the first and second multiplexers providing signals representative the write-read pointer offset signal.

17. The memory hub of claim 16 wherein the logic circuit comprises a plurality of three-input logic OR gates, each logic OR gate having first and second inputs coupled to outputs of two flip-flops of the first set of series coupled flip-flops and further having a third input coupled to an output of a respective flip-flop of the second set of series coupled flip-flops.

18. The memory hub of claim 16 wherein the data synchronizing circuit further comprises:
a first pair of series coupled flip-flops coupled to the output terminal of the first multiplexer, the first pair of series coupled flip-flops shifting the output of the first multiplexer though the flip-flops in response to the core clock signal; and
a second pair of series coupled flip-flops coupled to the output terminal of the second multiplexer, the second pair of series coupled flip-flops shifting the output of the second multiplexer though the flip-flops in response to the core clock signal.

19. A memory module, comprising:
a plurality of memory devices;
a memory bus coupled to the plurality of memory devices; and
a memory hub coupled to the plurality of memory devices through the memory bus, the memory hub, comprising:
a link interface receiving memory requests for access to memory locations in at least one memory device;
a memory device interface adapted to couple memory requests to memory devices for access to at least one of the memory devices and to receive read data responsive to at least some of the memory requests;
a memory controller coupled to the link interface and the memory device interface, the memory controller adapted to couple memory requests to the memory device interface responsive to memory requests received from the link interface responsive to a core clock signal, the memory controller further adapted to adjust the timing at which read memory requests are coupled to the memory device interface responsive to a write-read pointer offset signal; and
a read data synchronizing circuit coupled to the memory device interface, the read synchronization module, and the memory controller, the read data synchronizing circuit coupling read data from the memory devices operating according to a memory device clock signal to the memory controller, the read data synchronizing circuit comprising:
a data buffer coupled to the memory device and having a plurality of data locations at which read data are respectively stored;
a multiplexer coupled to the data buffer to selectively couple read data stored at respective data locations of the data buffer to an output terminal in accordance with a selection signal;
a write pointer circuit coupled to the memory device and the data buffer and adapted to generate a write pointer signal to sequentially select one of the plurality of data locations of the data buffer for storing read data received from the memory device responsive to a strobe signal provided by the memory device;
a read pointer circuit coupled to the multiplexer and adapted to generate responsive to the core clock signal a read pointer signal provided to the multiplexer to sequentially select one of the plurality of data locations of the buffer from which the read data stored therein is coupled to the output terminal of the multiplexer; and
a write-read pointer compare circuit coupled to the write and read pointer circuits to compare the write and read pointer signals and adapted to generate and provide the write-read pointer offset signal indicative of the comparison to the memory controller.

20. The memory module of claim 19 wherein the memory controller of the memory hub is further adapted to adjust the timing at which a write memory request immediately following a read memory request is coupled to the memory device interface responsive to the write-pointer offset signal.

21. The memory module of claim 19 wherein the memory controller of the memory hub is further adapted to adjust the timing at which a read memory request immediately following a write memory request is coupled to the memory device interface responsive to the write-pointer offset signal.

22. The memory module of claim 19 wherein the read data synchronizing circuit of the memory hub further comprises a data latch coupled to the output terminal of the multiplexer to latch the read data selectively coupled thereto responsive to the core clock signal.

23. The memory module of claim 19 wherein the read pointer circuit of the read data synchronizing circuit comprises a plurality of flip-flops adapted to output a respective bit of a count value in response to the core clock signal.

24. The memory hub of claim 23 wherein the write pointer circuit of the read data synchronizing circuit comprises:
a first set of series coupled flip-flops having an output of a last flip-flop coupled to an input of a first flip-flop, the first set of series coupled flip-flops shifting a flag through each flip-flop in response to a rising edge of the strobe signal; and
a second set of series coupled flip-flops having an output of a last flip-flop coupled to an input of a first flip-flop, the second set of series coupled flip-flops shifting a flag through each flip-flop in response to a falling edge of the strobe signal, the write pointer signal represented by output signals of the flip-flops of the first and second sets of series coupled flip-flops.

25. The memory module of claim 24 wherein the write-read compare circuit comprises:
   a logic circuit having a plurality of input nodes coupled to outputs of each flip-flop of the first and second sets of series coupled flip-flops and further having a plurality of output nodes, the logic circuit adapted to generate flag signals at each of the output nodes indicative of the location of the flag in the first and second sets of series coupled flip-flops;
   a first multiplexer having a plurality of input terminals coupled to the plurality of output nodes of the logic circuit, a selection terminal coupled to the read pointer circuit, and further having an output terminal, the first multiplexer selectively coupling one of the input terminals to the output terminal according to the read pointer signal provided by the read pointer circuit; and
   a second multiplexer having a plurality of input terminals coupled to the plurality of output nodes of the logic circuit, a selection terminal coupled to the read pointer circuit, and further having an output terminal, the second multiplexer selectively coupling one of the input terminals to the output terminal according to the read pointer signal provided by the read pointer circuit,
   the outputs of the first and second multiplexers providing signals representative the write-read pointer offset signal.

26. The memory module of claim 25 wherein the logic circuit comprises a plurality of three-input logic OR gates, each logic OR gate having first and second inputs coupled to outputs of two flip-flops of the first set of series coupled flip-flops and further having a third input coupled to an output of a respective flip-flop of the second set of series coupled flip-flops.

27. The memory module of claim 25 wherein the read data synchronizing circuit further comprises:
   a first pair of series coupled flip-flops coupled to the output terminal of the first multiplexer, the first pair of series coupled flip-flops shifting the output of the first multiplexer though the flip-flops in response to the core clock signal; and
   a second pair of series coupled flip-flops coupled to the output terminal of the second multiplexer, the second pair of series coupled flip-flops shifting the output of the second multiplexer though the flip-flops in response to the core clock signal.

28. A processor-based system, comprising:
   a processor having a processor bus;
   a system controller coupled to the processor bus, the system controller having a peripheral device port, the system controller further comprising a controller coupled to a system memory port;
   at least one input device coupled to the peripheral device port of the system controller;
   at least one output device coupled to the peripheral device port of the system controller;
   at least one data storage device coupled to the peripheral device port of the system controller;
   a memory bus coupled to the system controller for transmitting memory requests and responses thereon; and
   a plurality of memory modules coupled to the memory bus, each of the modules having:
   a plurality of memory devices; and
   a memory hub coupled to the memory devices through a memory device bus to access the memory devices, the memory hub comprising:
     a link interface receiving memory requests for access to memory locations in at least one memory device;
     a memory device interface adapted to couple memory requests to memory devices for access to at least one of the memory devices and to receive read data responsive to at least some of the memory requests;
     a memory controller coupled to the link interface and the memory device interface, the memory controller adapted to couple memory requests to the memory device interface responsive to memory requests received from the link interface responsive to a core clock signal, the memory controller further adapted to adjust the timing at which read memory requests are coupled to the memory device interface responsive to a write-read pointer offset signal; and
     a read data synchronizing circuit coupled to the memory device interface, the read synchronization module, and the memory controller, the read data synchronizing circuit coupling read data from the memory devices operating according to a memory device clock signal to the memory controller, the read data synchronizing circuit comprising:
       a data buffer coupled to the memory device and having a plurality of data locations at which read data are respectively stored;
       a multiplexer coupled to the data buffer to selectively couple read data stored at respective data locations of the data buffer to an output terminal in accordance with a selection signal;
       a write pointer circuit coupled to the memory device and the data buffer and adapted to generate a write pointer signal to sequentially select one of the plurality of data locations of the data buffer for storing read data received from the memory device responsive to a strobe signal provided by the memory device;
       a read pointer circuit coupled to the multiplexer and adapted to generate responsive to the core clock signal a read pointer signal provided to the multiplexer to sequentially select one of the plurality of data locations of the buffer from which the read data stored therein is coupled to the output terminal of the multiplexer; and
       a write-read pointer compare circuit coupled to the write and read pointer circuits to compare the write and read pointer signals and adapted to generate and provide the write-read pointer offset signal indicative of the comparison to the memory controller.

29. The processor-based system of claim 28 wherein the memory controller of the memory hub is further adapted to adjust the timing at which a write memory request immediately following a read memory request is coupled to the memory device interface responsive to the write-pointer offset signal.

30. The processor-based system of claim 28 wherein the memory controller of the memory hub is further adapted to adjust the timing at which a read memory request immediately following a write memory request is coupled to the memory device interface responsive to the write-pointer offset signal.

31. The processor-based system of claim 28 wherein the read data synchronizing circuit of the memory hub further comprises a data latch coupled to the output terminal of the multiplexer to latch the read data selectively coupled thereto responsive to the core clock signal.

32. The processor-based system of claim 28 wherein the read pointer circuit of the read data synchronizing circuit comprises a plurality of flip-flops adapted to output a respective bit of a count value in response to the core clock signal.

33. The processor-based system of claim 32 wherein the write pointer circuit of the read data synchronizing circuit comprises:
   a first set of series coupled flip-flops having an output of a last flip-flop coupled to an input of a first flip-flop, the first set of series coupled flip-flops shifting a flag through each flip-flop in response to a rising edge of the strobe signal; and
   a second set of series coupled flip-flops having an output of a last flip-flop coupled to an input of a first flip-flop, the second set of series coupled flip-flops shifting a flag through each flip-flop in response to a falling edge of the strobe signal,
   the write pointer signal represented by output signals of the flip-flops of the first and second sets of series coupled flip-flops.

34. The processor-based system of claim 33 wherein the write-read compare circuit comprises:
   a logic circuit having a plurality of input nodes coupled to outputs of each flip-flop of the first and second sets of series coupled flip-flops and further having a plurality of output nodes, the logic circuit adapted to generate flag signals at each of the output nodes indicative of the location of the flag in the first and second sets of series coupled flip-flops;
   a first multiplexer having a plurality of input terminals coupled to the plurality of output nodes of the logic circuit, a selection terminal coupled to the read pointer circuit, and further having an output terminal, the first multiplexer selectively coupling one of the input terminals to the output terminal according to the read pointer signal provided by the read pointer circuit; and
   a second multiplexer having a plurality of input terminals coupled to the plurality of output nodes of the logic circuit, a selection terminal coupled to the read pointer circuit, and further having an output terminal, the second multiplexer selectively coupling one of the input terminals to the output terminal according to the read pointer signal provided by the read pointer circuit,
   the outputs of the first and second multiplexers providing signals representative the write-read pointer offset signal.

35. The processor-based system of claim 34 wherein the logic circuit comprises a plurality of three-input logic OR gates, each logic OR gate having first and second inputs coupled to outputs of two flip-flops of the first set of series coupled flip-flops and further having a third input coupled to an output of a respective flip-flop of the second set of series coupled flip-flops.

36. The processor-based system of claim 34 wherein the read data synchronizing circuit further comprises:
   a first pair of series coupled flip-flops coupled to the output terminal of the first multiplexer, the first pair of series coupled flip-flops shifting the output of the first multiplexer though the flip-flops in response to the core clock signal; and
   a second pair of series coupled flip-flops coupled to the output terminal of the second multiplexer, the second pair of series coupled flip-flops shifting the output of the second multiplexer though the flip-flops in response to the core clock signal.

37. A method of adjusting the timing of retrieving read data from a buffer, the method comprising:
   requesting read data from at least one memory device;
   sequentially selecting data locations of the buffer at which read data are stored responsive to a strobe signal provided by the memory device, the currently selected data location at which read data is stored identified by a write pointer incremented responsive to the strobe signal;
   sequentially selecting data locations of the buffer from which stored read data is retrieved response to a core clock signal, the currently selected data location from which read data is retrieved identified by a read pointer incremented responsive to the core clock signal;
   comparing the write pointer and the read pointer to determine a write-read pointer offset indicative of the relative timing between storing the read data to a data location and retrieving the read data from the data location; and
   based on the write-read pointer offset, decreasing the time between storing the read data in a data location in the buffer and retrieving read data from the buffer in response to the write-read pointer offset indicative of a data location offset greater than initial number of data locations.

38. The method of claim 37 wherein adjusting the timing of retrieving read data from the buffer relative to the storing of the read data in a data location in the buffer comprises increasing the time between storing the read data in a data location in the buffer and retrieving read data from the buffer in response to the write-read pointer offset indicative of a data location offset less than a initial number of data locations.

39. The method of claim 37 wherein adjusting the timing of retrieving read data from the buffer relative to the storing of the read data in a data location in the buffer comprises adjusting the timing when no memory requests are pending.

40. The method of claim 37 wherein comparing the write pointer and the read pointer to determine a write-read pointer offset comprises comparing the write pointer and the read pointer during a burst memory read operation.

41. The method of claim 37 wherein sequentially selecting data locations of the buffer at which read data are stored responsive to a strobe signal provided by the memory device comprises shifting a first flag bit in response to a rising edge of a strobe signal through a first set of series coupled flip-flops having a last flip-flop coupled to a first flip-flop of the set and shifting a second flag bit in response to a falling edge of the strobe signal through a second set of series coupled flip-flops having a last flip-flop coupled to a first flip-flop of the set.

42. A method of adjusting the relative timing between issuing memory write commands and memory read commands, the method comprising:
   storing read data provided by at least one memory device in sequentially selected data locations of a buffer, the data location at which read data are currently stored selected by a write pointer;
   retrieving read data stored in the buffer from sequentially selected data locations, the data location from which read data are currently retrieved selected by a read pointer;
   generating a write-read pointer offset indicative of a data location offset between the data location selected by the write pointer and the data location selected by the read pointer;
   and adjusting the timing between the issuance of a memory write command immediately following a memory read command based on the write-read pointer offset.

43. The method of claim 42 wherein adjusting the timing between the issuance of memory write commands and memory read commands based on the write-read pointer offset comprises adjusting the timing between the issuance of a memory read command immediately following a memory write command based on the write-read pointer offset.

44. The method of claim 42 wherein adjusting the timing between the issuance of memory write commands and memory read commands based on the write-read pointer offset comprises adjusting the timing when no memory requests are pending.

45. The method of claim 42 wherein generating the write-read pointer offset comprises comparing the write pointer and the read pointer during a burst memory read operation and generating the write-read pointer in response to the comparison.

46. The method of claim 42 wherein storing read data provided by at least one memory device in sequentially selected data locations of a buffer comprises shifting a first flag bit in response to a rising edge of a strobe signal through a first set of series coupled flip-flops having a last flip-flop coupled to a first flip-flop of the set and shifting a second flag bit in response to a falling edge of the strobe signal through a second set of series coupled flip-flops having a last flip-flop coupled to a first flip-flop of the set to provide a buffer selection signal for sequentially selecting the data locations.

* * * * *